(12) United States Patent
Arao

(10) Patent No.: US 7,189,994 B2
(45) Date of Patent: Mar. 13, 2007

(54) SEMICONDUCTOR DEVICE AND METHOD FOR MANUFACTURING THE SAME

(75) Inventor: Tatsuya Arao, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/677,316

(22) Filed: Oct. 3, 2003

(65) Prior Publication Data
US 2004/0075092 A1   Apr. 22, 2004

(30) Foreign Application Priority Data
Oct. 7, 2002   (JP)  ............................. 2002-293499

(51) Int. Cl.
*H01L 29/04*   (2006.01)
*H01L 31/036*   (2006.01)
*H01L 31/0376*   (2006.01)
*H01L 31/20*   (2006.01)

(52) U.S. Cl. ............................. 257/59; 257/66; 257/73; 257/319; 257/320; 257/347

(58) Field of Classification Search .................. 257/59, 257/66, 72, 73, 347, 319, 320
See application file for complete search history.

(56) References Cited

U.S. PATENT DOCUMENTS

| | | | |
|---|---|---|---|
| 4,849,798 A * | 7/1989 | Wantanabe | .................. 257/253 |
| 5,164,805 A * | 11/1992 | Lee | .............................. 257/351 |
| 5,475,238 A | 12/1995 | Hamada | |
| 5,835,172 A | 11/1998 | Yeo et al. | |
| 5,973,378 A | 10/1999 | Ohtani | |
| 6,150,700 A | 11/2000 | Lee | |
| 6,255,166 B1 * | 7/2001 | Ogura et al. | ................. 438/257 |
| 6,278,131 B1 | 8/2001 | Yamazaki et al. | |
| 6,316,787 B1 | 11/2001 | Ohtani | |
| 6,555,424 B2 | 4/2003 | Lin et al. | |

(Continued)

FOREIGN PATENT DOCUMENTS

JP   03-280018   12/1991

(Continued)

OTHER PUBLICATIONS

Tanaka et al., "A Novel Unified-Structure Field-Induction-Drain (UFID) Poly-Si TFTs in CMOS Circuits for LCD Application", *SID 91 Digest*, pp. 539-542, May 1991.

(Continued)

*Primary Examiner*—Thien F. Tran
(74) *Attorney, Agent, or Firm*—Nixon Peabody LLP; Jeffrey L. Costellia

(57) ABSTRACT

It is an object of the present invention to form a TFT which is required to have a high withstanding voltage characteristic as well as to lower an off-current, a TFT which is required to have a high withstanding voltage characteristic as well as to raise an on-current, and a TFT in which a short channel structure and the decline in the threshold voltage arising therefrom are attached importance to, on one and the same substrate. A TFT having gate insulating films with different thickness can be formed on one and the same substrate by providing auxiliary electrodes in addition to the gate electrodes over a semiconductor film as well as laminating the insulating films.

64 Claims, 13 Drawing Sheets

U.S. PATENT DOCUMENTS

| | | |
|---|---|---|
| 6,590,229 B1 | 7/2003 | Yamazaki |
| 6,593,592 B1 | 7/2003 | Yamazaki et al. |
| 6,639,244 B1 | 10/2003 | Yamazaki et al. |
| 6,639,265 B2 | 10/2003 | Arao et al. |
| 6,657,228 B2 | 12/2003 | Ohtani |
| 2002/0014624 A1 | 2/2002 | Yamazaki et al. |
| 2002/0175376 A1 | 11/2002 | Ohtani et al. |

FOREIGN PATENT DOCUMENTS

| | | |
|---|---|---|
| JP | 04-219736 | 8/1992 |
| JP | 05-251702 | 9/1993 |
| JP | 8-17238 | 2/1996 |
| JP | 11-345976 | 12/1999 |
| JP | 2000-058849 | 2/2000 |
| JP | 2000-284722 | 10/2000 |
| JP | 2002-50770 | 2/2002 |

OTHER PUBLICATIONS

Specification for abandoned U.S. Appl. No. 07/910,412, filed Jul. 8, 1992.

* cited by examiner

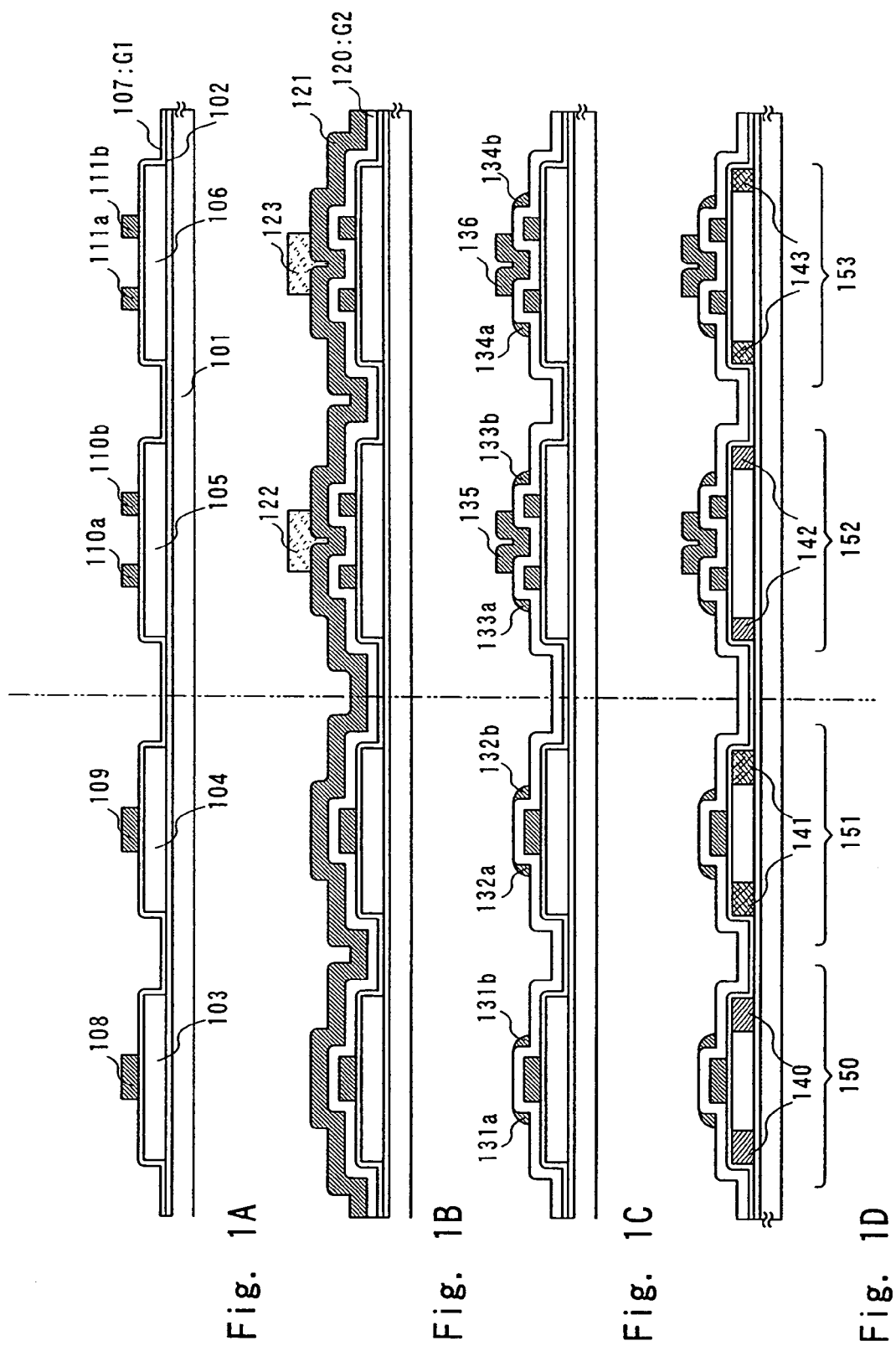

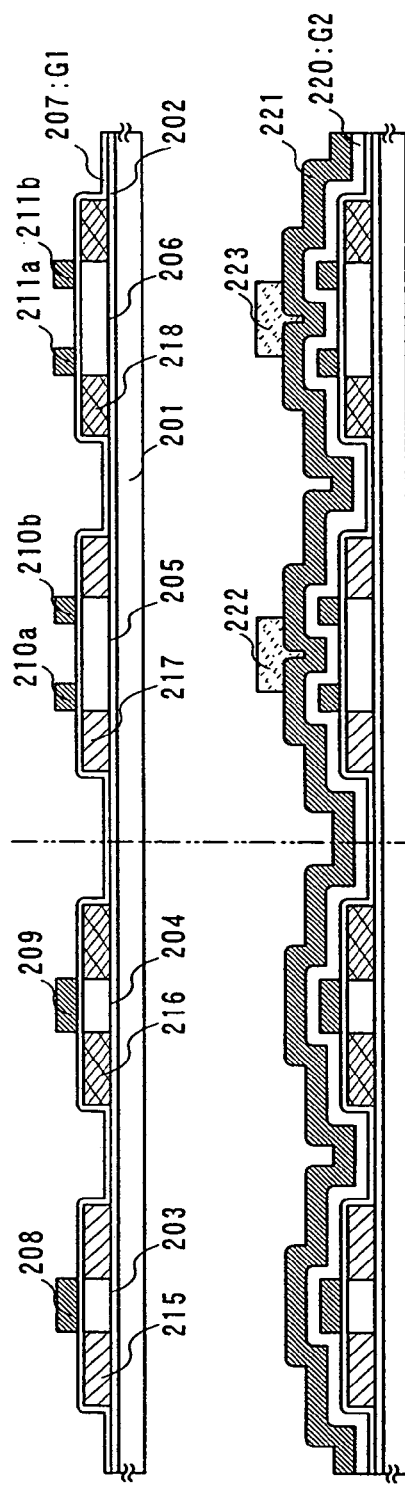
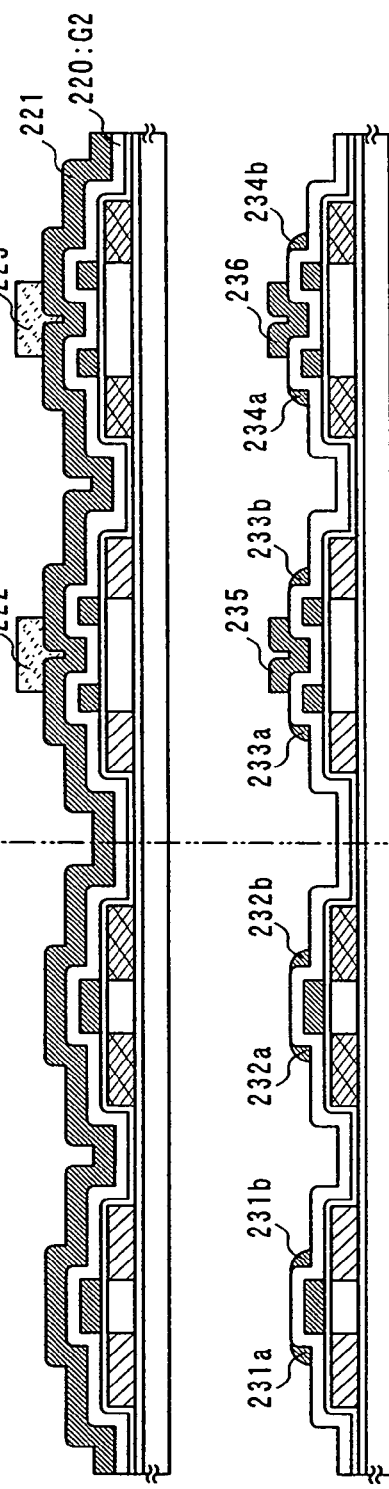
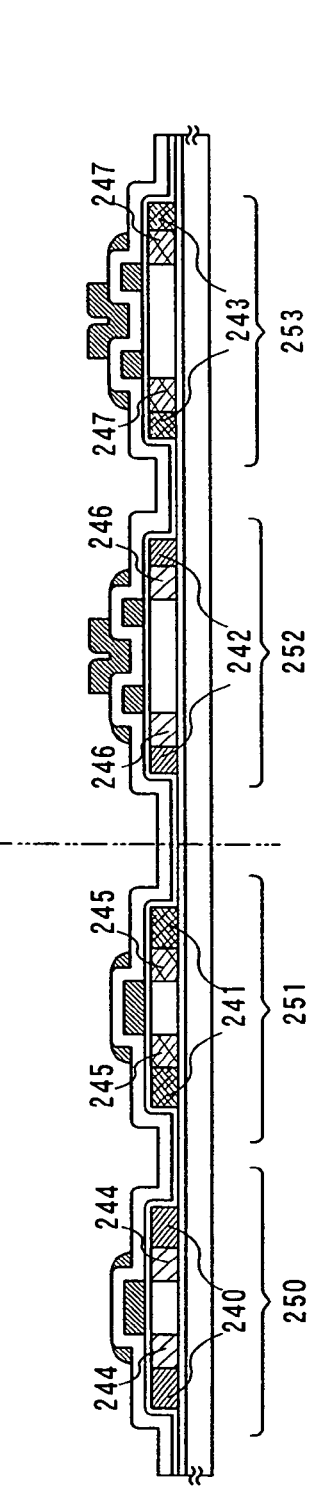
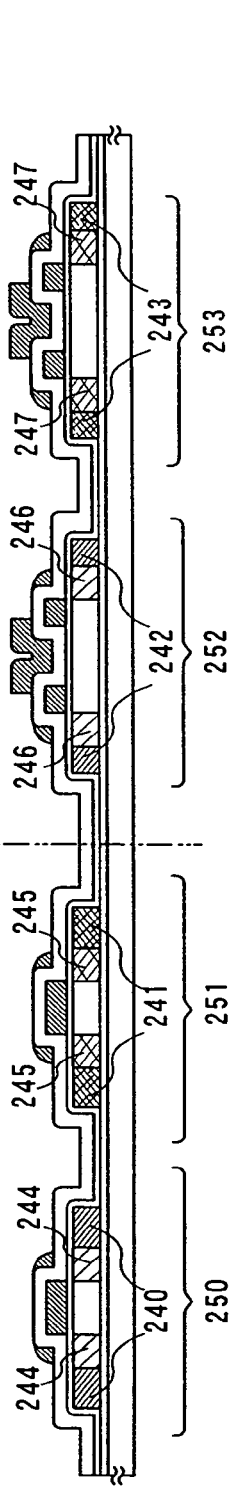
Fig. 2A
Fig. 2B
Fig. 2C
Fig. 2D

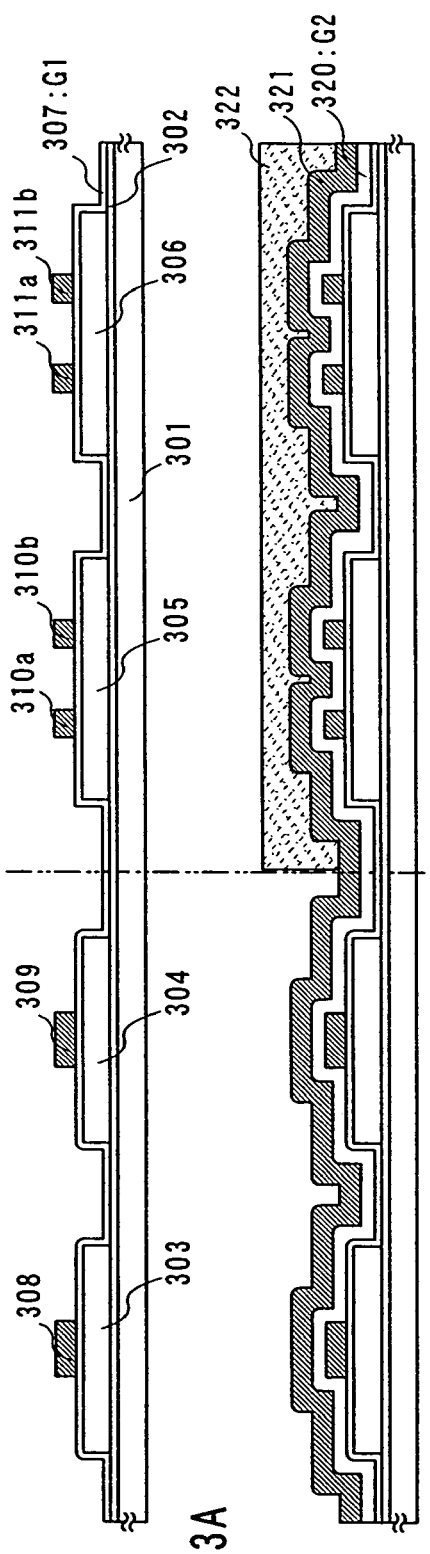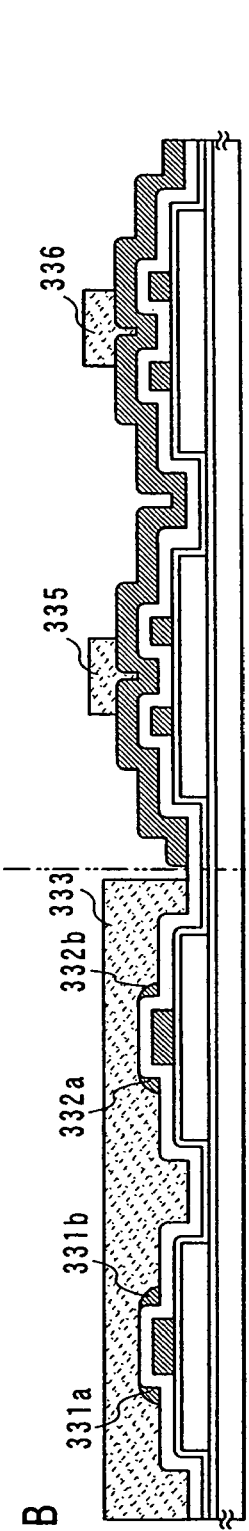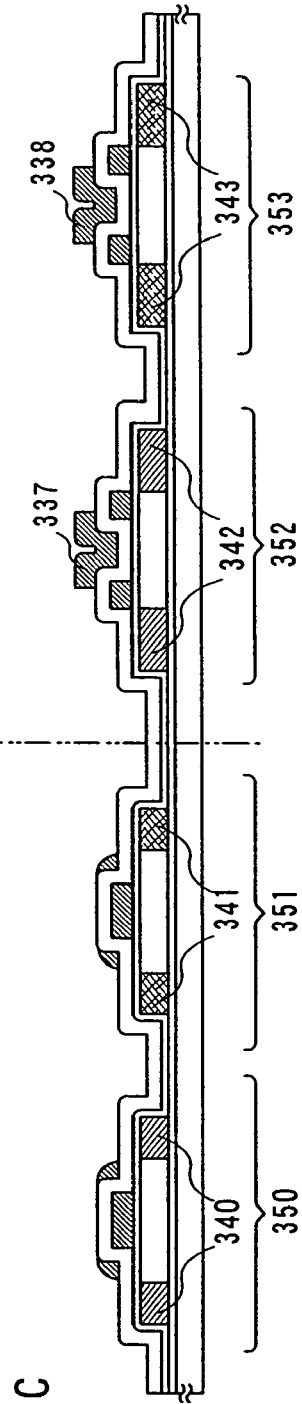

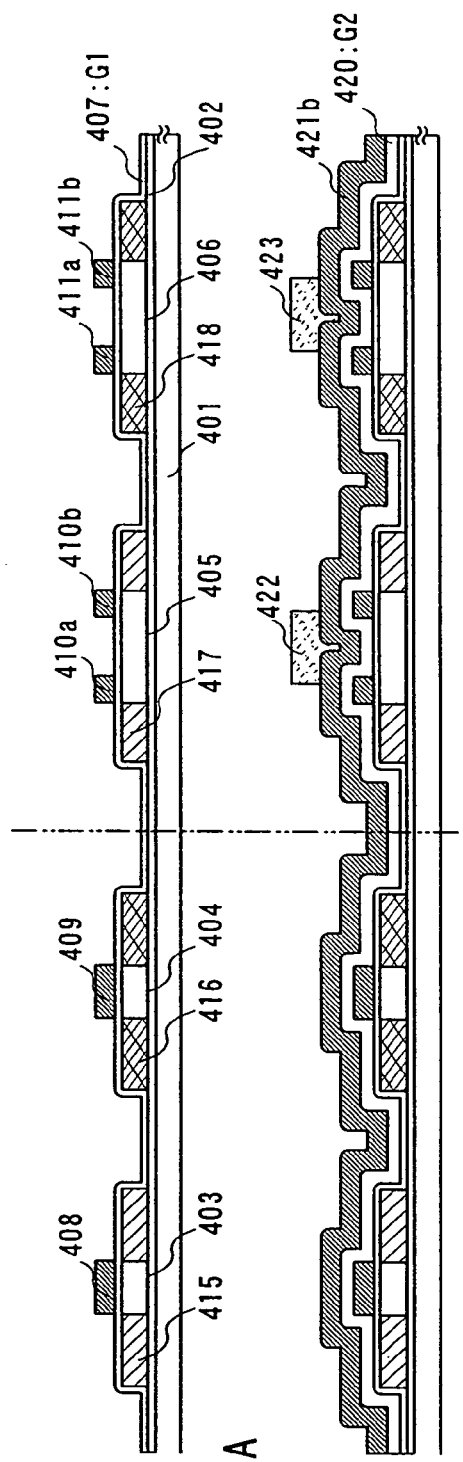
Fig. 4A
Fig. 4B
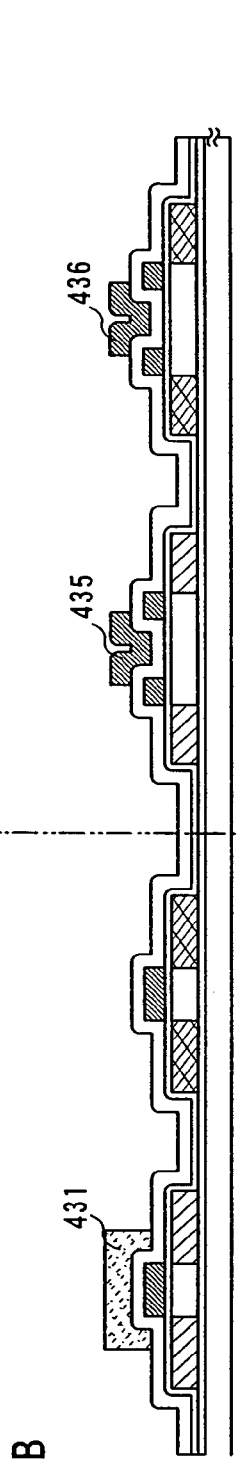
Fig. 4C
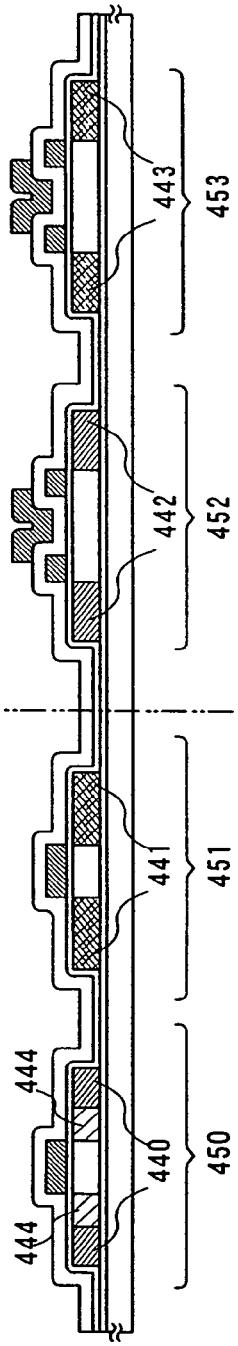
Fig. 4D

SEMICONDUCTOR DEVICE AND METHOD FOR MANUFACTURING THE SAME

BACKGROUND OF THE INVENTION

1. Field of the Invention

The present invention relates to a semiconductor device which comprises a circuit formed from a thin film transistor (hereinafter referred to as TFT) and the manufacturing method thereof. The present invention further relates to a display module typified by an active matrix liquid crystal module and an EL module, each fabricated using a TFT, and also to an electronic device which comprises such display modules as its components.

2. Description of the Related Art

Recently, the development of a semiconductor device having a large-scale integrated circuit formed from a TFT has been advanced. The TFT comprises a thin semiconductor film (with a thickness of about several to several hundred nanometers) formed over a substrate having an insulating surface. An active matrix liquid crystal display device, an EL display device, and a close coupling image sensor are known as typical examples of the semiconductor devices. Further, a system on panel is proposed, wherein a central processing unit (hereinafter referred to as a CPU), a dynamic random-access memory (hereinafter referred to as a DRAM), an image processing circuit, a sound processing circuit and the like are provided on one and the same substrate besides a pixel portion and a driving circuit portion. Particularly, a TFT having crystalline silicon film as an active layer has high electron field-effect mobility, therefore the TFT is applicable to form a circuit with various functions.

For example, in a liquid crystal module mounted in a liquid crystal display device, a pixel circuit for displaying an image in each functional block and a driving circuit for controlling the pixel circuit, functional circuits are formed on a single substrate. The driving circuit includes a shift register circuit, a level shifter circuit, a buffer circuit, a sampling circuit, and the like, using CMOS circuits as a fundamental circuit. And, functional circuits include a CPU, a DRAM, an image processing circuit, a sound processing circuit, and the like except a pixel circuit and a driving circuit.

A TFT of a pixel region (hereinafter referred to as a pixel TFT) is formed of an n-channel TFT, and it drives a liquid crystal by applying voltage thereto as a switching device. Since a liquid crystal is driven with an alternating current, a system called frame inversion drive is mostly adopted. As for this system, a pixel TFT is required to have characteristics of keeping an off-current value (a drain current which flows during an off operation of a TFT) sufficiently low in order to suppress power consumption.

A lightly doped drain (hereinafter referred to as LDD) structure is known as a TFT structure for lowering the off-current value. This structure has a region doped with dilute impurity elements between a channel forming region and a source region or between a channel forming region and a drain region; the region is called an LDD region. The LDD structure has an effect of preventing deterioration due to injection of hot carriers by alleviating an electrical field adjacent to a drain.

A driving circuit (a buffer circuit, a level shifter circuit, a sampling circuits, and the like) which drives a pixel TFT uses a CMOS circuit as fundamental circuit. A TFT used for a driving circuit preferably has a structure wherein an on-current is to be attached more importance to than an off-current. An LDD region is provided below a gate electrode in this structure. An LDD structure had a disadvantage of reducing an on-current as well as off-current, however, this structure can decrease deterioration of on-current due to an injection of hot carriers by alleviating an electric field adjacent to a drain.

As to a driving circuit, a buffer circuit, a level shifter circuit, a sampling circuit, and the like are circuits for applying voltage to a gate wiring in a pixel region, and high voltage is applied to the driving circuit as well as a pixel region. Therefore, a thick gate insulating film is required.

Further, a TFT of a functional circuit including a CPU, a DRAM, an image processing circuit, a sound processing circuit, and the like except a pixel circuit and a driving circuit needs high speed operation; accordingly, a short channel TFT is preferable. However, a short channel TFT causes threshold voltage decline and allows an off-current to flow easily. Therefore, a TFT with a short channel and a thin gate insulating film is preferable for a TFT used for a CPU, a DRAM, an image processing circuit, a sound processing circuit, and the like.

Thus, a process becomes complex when manufacturing TFTs having different structures on one and the same substrate. Specifically, in the case of manufacturing a short channel TFT, only mask design needs to be changed, however, in the case of making the thickness of gate insulating films different in each region of a substrate, a process different from the conventional one needs to be introduced. In particular, the process described below is employed: only a gate insulating film of a TFT for a driving circuit is etched; a thermally-oxide film is formed by heating it at a high temperature; a gate insulating film of a TFT for a driving circuit is made thin; and a gate insulating film for a pixel TFT is made thick (See reference 1: Japanese Patent laid-open No. 2000-284722).

SUMMARY OF THE INVENTION

A structure appropriable for all the TFTs described below has not been established: A pixel TFT which is required to have a high withstanding voltage characteristic as well as to lower an off-current, a TFT for a driving circuit which is required to have a high withstanding voltage characteristic as well as to raise an on-current, such as a buffer circuit, a shift register circuit, level shifter circuit, or a sampling circuit, or a TFT for a functional circuit, such as a CPU, a DRAM, an image processing circuit, or a sound processing circuit wherein a short channel structure and the decline in the threshold voltage arising therefrom are attached importance to.

In addition, there is a problem of increase in the manufacturing process for its complexity in forming a TFT having an LDD structure and a TFT wherein an LDD region is overlapped with a gate electrode with a gate insulating film interposed therebetween. It is obvious that the increase in the manufacturing process raises the manufacturing cost and also lowers the manufacturing yield.

The present invention provides a technique for solving such problems. Specifically, in a semiconductor device having a circuit formed from TFTs, an electro-optic device manufactured with TFTs, typified by an active matrix liquid crystal device, or a light emitting device typified by an EL display device, the present invention provides a method for severally fabricating TFTs having different structures on one and the same substrate by applying a process similar to the conventional one. Namely, a TFT in which a gate insulating film is multi layered and also an electrode different from a gate electrode (hereinafter referred to as an auxiliary electrode) is placed on a semiconductor film is proposed. It is an object of the present invention to provide TFTs having gate insulating films with different thickness on one and the same substrate, to improve the reliability and the performance characteristics of a semiconductor device, and to reduce the power consumption. Also, it is an object of the present invention to provide a TFT structure realizing reduction in manufacturing cost and yield improvement by applying the conventional process.

Moreover, fining pitch of the respective display pixels is promoted in proportion to higher definition (increase in the number of pixels) and miniaturization. When manufacturing a TFT finely, mask alignment is important. And misalignment may cause the problem of reduction in yield. The present invention further provides a TFT structure wherein yield improvement is realized in an electro-optic device manufactured with TFTs, typified by an active matrix liquid crystal device or a light emitting device typified by an EL display device.

A configuration of the invention disclosed in this specification comprises: a semiconductor layer comprising a channel forming region; a first insulating film formed on the semiconductor layer; an auxiliary electrode formed over the semiconductor layer with the first insulating film interposed therebetween; a second insulating film formed on the first insulating film and the auxiliary electrode; and a gate electrode formed over the channel forming region with the first insulating film and second insulating film interposed therebetween, wherein the auxiliary electrode is formed outside of the channel forming region.

Another configuration of the invention disclosed in the specification comprises: a semiconductor layer comprising a channel forming region; a first insulating film formed on the semiconductor layer; an auxiliary electrode for controlling the carrier density between a source region, a drain region, and the channel forming region in the semiconductor layer; a second insulating film formed on the first insulating film and the auxiliary electrode; and a gate electrode formed over the channel forming region with the first insulating film and second insulating film interposed therebetween.

In the above configurations of the invention, the thickness of the first insulating film is 1 to 100 nm, preferably 5 to 50 nm, and the thickness if the second insulating film is 5 to 100 nm.

When one auxiliary electrode is provided for a tin film transistor, the auxiliary electrode is provided between a channel forming region and a drain region in a semiconductor layer. On the other hand, when two auxiliary electrodes are provided for a TFT, one of the auxiliary electrodes is provided between a source region and a channel forming region, and the other is provided between a drain region and the channel forming region.

Each of the auxiliary electrode and the gate electrode is connected to a different wiring.

The auxiliary electrode may be partially overlapped with the gate electrode with the second insulating film interposed therebetween.

Impurity element may be doped in a region of the semiconductor layer opposed to the auxiliary electrode through the first insulating film. That is, the semiconductor layer may have a low-concentration impurity region between the channel forming region and at least one of the source and drain regions. In this case, the low-concentration impurity region is formed under the auxiliary electrode.

Another configuration of the invention disclosed in the specification comprises: a first thin film transistor over a substrate, the first thin film transistor comprising a first semiconductor layer, a first gate insulating film, and a first gate electrode; a second thin film transistor over the substrate, the second thin film transistor comprising a second semiconductor layer, a second gate insulating film having lamination films, and a second gate electrode; and a first auxiliary electrode formed between the lamination films, wherein the first auxiliary electrode is formed outside of a channel forming region in the second semiconductor layer and wherein the first gate insulating film is thinner than the second gate insulating film.

Another configuration of the invention disclosed in the specification comprises: a first thin film transistor over a substrate, the first thin film transistor comprising a first semiconductor layer, a first gate insulating film, and a first gate electrode; a second thin film transistor over the substrate, the second thin film transistor comprising a second semiconductor layer, a second gate insulating film having a lamination films, a second gate electrode; a first auxiliary electrode for controlling the carrier density between a source region or drain region and a channel forming region in the second semiconductor layer, wherein the first auxiliary electrode is formed between the lamination films, and wherein the first gate insulating film is thinner than the second gate insulating film.

In the above configurations of the invention, thickness of the first insulating film is 1 to 100 nm, preferably 5 to 50 nm, and the thickness of the second gate insulating film is 6 to 200 nm.

One of the lamination films is a same film as the first gate insulating film.

Each of the first auxiliary electrode, the first gate electrode, and the second gate electrode is connected to a different wiring.

When one auxiliary electrode is provided for a thin film transistor, the auxiliary electrode is provided between a channel forming region and a drain region in a semiconductor layer. On the other hand, when two auxiliary electrodes are provided for a TFT, one of the auxiliary electrodes is provided between a source region and a channel forming region, and the other is provided between a drain region and the channel forming region.

The first thin film transistor may further comprises an insulating film covering the first gate electrode and the first gate insulating film, and a second auxiliary electrode formed on the insulating film.

In this case, the second auxiliary electrode has a curved surface or an inclined surface.

Impurity element may be doped in a region of the semiconductor layer opposed to the first auxiliary electrode through the first insulating film. That is, the semiconductor layer may have a low-concentration impurity region between the channel forming region and at least one of the source and drain regions. In this case, the low-concentration impurity region is formed under the first auxiliary electrode.

Another configuration of the invention disclosed in the specification comprises: forming a first semiconductor layer and a second semiconductor layer on an insulating surface; forming a first insulating film on the first semiconductor layer and the second semiconductor layer; forming a first gate electrode and a first auxiliary electrode on the first insulating film; forming a second insulating film on the first gate electrode, the first auxiliary electrode, and the first insulating film; and forming a second gate electrode on the second insulating film, wherein the first gate electrode is formed over the first semiconductor layer with the first insulating film interposed therebetween, wherein the first auxiary electrode is formed over the second semiconductor layer with the first insulating film interposed therebetween, and wherein the second gate electrode is formed over the second semiconductor layer with the first and second insulating film interposed therebetween.

In the above configuration of the invention, the first auxiliary electrode, the first gate electrode, and the second gate electrode are etched so that each of these electrodes is connected to a different wiring.

A second auxiliary electrode can be formed on the second insulating film at the same time when the second gate electrode is formed. In this case, the second auxiliary electrode is connected to a different wiring from the wiring mentioned above.

The second electrode is formed over the second semiconductor layer and first auxiliary electrode.

Since the configurations of the present invention makes it possible to control the carrier density between the source region or drain region and the channel forming region without forming the LDD region, misalignment of a mask used in a process for forming the LDD region can be avoided, and thus decrease in yield can be restrained.

According to the configurations of the present invention, a number of TFTs having gate insulating films each having different thickness can be formed on a same substrate without using a special process. Moreover, even if the LDD region is not formed, an optional voltage is applied to the first auxiliary electrode and second auxiliary electrode, thereby the carrier density in the semiconductor layer under respective auxiliary electrodes can be changed.

In addition, a TFT having a thick gate insulating film is used as a TFT for a driving circuit such as a shift register circuit, level shifter circuit, buffer circuit, or sampling circuit and a pixel TFT, thereby a TFT, which has a high withstanding voltage, enables a low power consumption design, and has a high reliability, can be made. Furthermore, a TFT having a short channel length and a thin gate insulating film is used as a TFT for functional circuits including CPU, DRAM, an image processing circuit, and an audio processing circuit, thereby operating characteristics and reliability can be improved.

BRIEF DESCRIPTION OF THE DRAWINGS

In the accompanying drawings:
FIGS. 1A–1D show Embodiment Mode 1;
FIGS. 2A–2D show Embodiment Mode 2;
FIGS. 3A–3D show Embodiment Mode 3;
FIGS. 4A–4D show Embodiment Mode 4.

DETAILED DESCRIPTION OF THE PREFERRED EMBODIMENTS

Embodiment Mode 1

Figure 5:
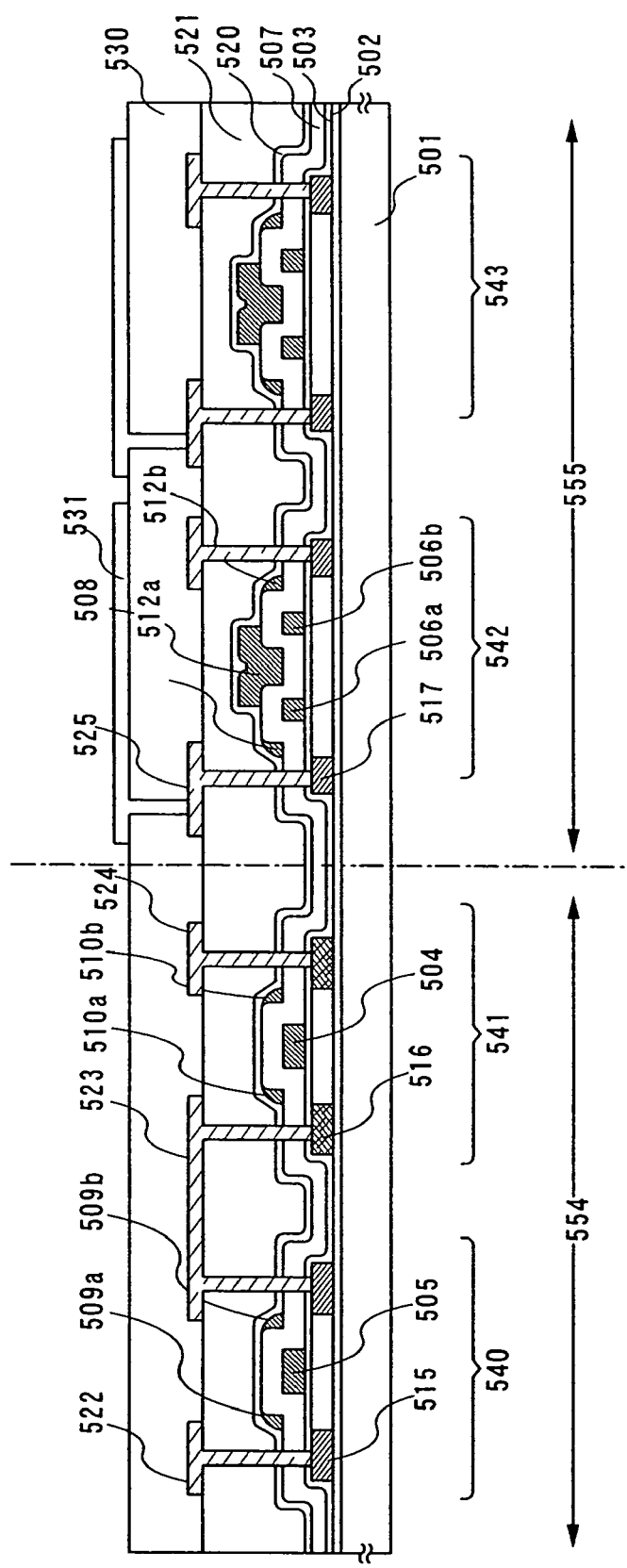
FIG. 5 shows an example of a cross sectional view of a liquid crystal display device (Embodiment 1)

An example of the invention is shown in FIGS. 1A–1D. This embodiment shows a process where a P-TFT and N-TFT having a thin gate insulating film and first auxiliary electrodes (in FIGS. 1A–1D, TFT comprising the gate insulating film G1), and a P-TFT and N-TFT having a thick gate insulating film, first auxiliary electrodes, and second auxiliary electrodes (in FIGS. 1A–1D, TFT comprising the gate insulating film G1 and G2) are formed at the same time.

As shown in FIG. 1A, a crystalline semiconductor film is formed on a substrate 101 through an insulating film 102 as a base film, then the crystalline semiconductor film is etched in an optional pattern and thus separated crystalline semiconductor films 103 to 106 are formed. Then, a first gate insulating film (hereinafter, shown as G1 in the embodiment and FIGS. 1A–1D) 107 is deposited. Typically, the first gate insulating film (G1) 107 functions as a gate insulating film for a TFT for a driving circuit to which a fast operation is required. Thickness of the first gate insulating film is small, 1 to 100 nm, and preferably 5 to 50 nm. When the thickness is smaller than thickness within the range, a problem of formation of parasitic capacity and resultant difficulty in the fast operation occurs.

Next, a first conductive film is deposited, then masks (not shown) are formed using a photolithography technique, then an unnecessary area in the first conductive film is removed using a known etching method, and thus first gate electrodes 108, 109 and first auxiliary electrodes 110a, 110b, 111a, and 111b are formed in a desired pattern. The electrodes are formed as the gate electrodes (hereinafter, described as first gate electrodes in the embodiment) in a TFT having a thin gate insulating film, and formed as the auxiliary electrodes (hereinafter, described as first auxiliary electrodes in the embodiment) in a TFT having a thick gate insulating film. The first auxiliary electrodes in a TFT are preferably arranged with an optional interval. Typically, the electrodes are arranged with an interval approximately equal to a channel length (4 to 12 µm, preferably 6 to 10 µm).

Next, as shown in FIG. 1B, a second gate insulating film 120 (hereinafter, shown as G2 in the embodiment and FIG. 1) is formed. The first gate insulating film (G1) and second gate insulating film (G2) are gate insulating films for the TFT having a thick gate insulating film (in FIGS. 1A–1D, TFT comprising the gate insulating film G1 and G2), and typically function as gate insulating films for the pixel TFT or a TFT to which the withstanding voltage is required such as the TFT in the buffer circuit. Therefore, thickness of the second gate insulating film (G2) is larger than that of the first gate insulating film, and preferably 5 to 100 nm.

Next, a second conductive film 121 is formed, then masks 122, 123 are formed using a photolithography technique, then an unnecessary area in the second conductive film is removed using a known etching method, and thus second gate electrodes and second auxiliary electrodes are formed in a desired pattern. The electrodes are formed as auxiliary electrodes in a TFT having a thin gate insulating film (in FIG. 1, TFT comprising the gate insulating film G1), and formed as a gate electrode and an auxiliary electrode in a TFT having a thick gate insulating film (in FIGS. 1A–1D, TFT comprising the gate insulating film G1 and G2).

When the second conductive film is etched, first, the resist masks 122, 123 are formed in an area where the second gate electrodes are formed. After that, as shown in FIG. 1C, the second conductive film is etched, thereby the second auxiliary electrodes 131a to 134a and 131b to 134b are formed. In this case, by properly fitting conditions, the second auxiliary electrodes having a curved surface, that is, the second auxiliary electrodes 131a to 134a and 131b to 134b that incline towards the first gate insulating film 107 and second gate insulating film 120 formed on the semiconductor layers 103 to 106 are formed in an optional pattern.

In FIGS. 1A–1D, thickness of the crystalline semiconductor film is depicted almost equal to thickness of the first gate electrode for convenience, however, actually the thickness of the crystalline semiconductor film is 25 to 70 nm, and the thickness of the gate electrodes is 120 to 500 nm. Therefore, while the auxiliary electrodes can be formed on a side of the gate electrodes having a large difference in thickness, the auxiliary electrodes can not be formed on a side of the crystalline semiconductor film. Then, the second gate electrodes 135 and 136 are formed by removing the resist masks.

Next, as shown in FIG. 1D, doping is performed using the first gate electrodes 108, 109, the second auxiliary electrodes 131a to 134a and 131b to 134b, the second gate electrodes 135, 136, and the first auxiliary electrodes 110a, 110b, 111a, and 111b as masks, thereby the source region and drain region are formed by adding an impurity element. Dopant that pertains n-type or p-type is added to a source region or drain region 141, 143 in a P-channel type TFT and a source region or drain region 140, 142 in an N-channel type TFT in a density range of $1 \times 10^{20}$ to $1 \times 10^{21}/cm^3$.

The LDD region can be provided by performing the doping to the crystalline semiconductor film under the first auxiliary electrodes 110a, 110b, 111a, and 111b.

Although a couple of first auxiliary electrodes were formed in the n-channel type TFT 152 and p-channel type TFT 153, the electrode can be formed singly. In this case, the auxiliary electrode is provided between the drain region and gate electrode.

According to the above process, the n-channel type TFT 150 or p-channel type TFT 151 having a thin gate insulating film, and the n-channel type TFT 152 or p-channel type TFT 153 having a thick gate insulating film are formed at the same time.

In the embodiment, since each of the first gate electrodes, first auxiliary electrodes, second gate electrodes, and second auxiliary electrodes is patterned individually, an optional voltage can be applied to each of the electrodes. Therefore, in consideration of functions required for respective TFTs, an optional voltage is applied to the first auxiliary electrodes and second auxiliary electrodes, thereby carrier density within the crystalline semiconductor film under respective auxiliary electrodes can be controlled. That is, hot carrier effect can be restrained with a similar function as the LDD region. Typically, in a low-on-current TFT, resistance can be preferably decreased in the crystalline semiconductor film by controlling the applied voltage to the auxiliary electrodes and increasing the carrier density. In a high-off-current TFT, the resistance can be preferably increased in the crystalline semiconductor film by controlling the applied voltage to the auxiliary electrodes and restraining the carrier density. The second gate electrodes and second auxiliary electrodes can be unseparated or connected with each other.

Electrical potential of the first auxiliary electrodes and second auxiliary electrodes need not be fixed, and can be changed with time in consideration of functions required for respective TFTs. That is, in a TFT, it is possible to increase the on-current or decrease the off-current by adjusting the voltage applied to the auxiliary electrodes. In this case, the voltage applied to the auxiliary electrodes can be properly controlled according to the required off-current or on-current.

According to the above process, TFTs with gate insulating films having different thickness each can be made on a same substrate without using a special process. Moreover, even if the LDD region is not formed, the carrier density in the crystalline semiconductor film under respective auxiliary electrodes can be changed by applying an optional voltage to the first auxiliary electrodes and second auxiliary electrodes. Thus, the hot carrier effect, which may occur at a junction interface between the channel forming region and the source region or drain region, can be restrained. Therefore, the TFT having a thick gate insulating film is used as the TFT for the driving circuit such as the shift register circuit, level shifter circuit, buffer circuit, or sampling circuit and used as the pixel TFT, thereby a TFT having the high withstanding voltage characteristics enables the low power consumption design and the high reliability. Furthermore, a TFT having a short channel length and a thin gate insulating film is used as a TFT for the functional circuits including the CPU, DRAM, image processing circuit, and audio processing circuit, thereby the operating characteristics and reliability can be improved.

Embodiment Mode 2

An example of the invention is shown in FIGS. 2A–2D. The embodiment shows a process for forming a TFT having the LDD region in the active matrix substrate described in the first embodiment.

As shown in FIG. 2A, a crystalline semiconductor film is formed on a substrate 201 through an insulating film 202 as a base film, and then the crystalline semiconductor film is etched in an optional pattern and thus separated crystalline semiconductor films 203 to 206 are formed. Then, a first gate insulating film (hereinafter, shown as G1 in the embodiment and FIGS. 2A–2D) 207 is deposited. The first gate insulating film (G1) 207 has a small thickness, and the thickness of the first gate insulating film is 1 to 100 nm, preferably 5 to 50 nm.

Next, a first conductive film is deposited, then masks (not shown) are formed using the photolithography technique, then an unnecessary area in the first conductive film is removed using a known etching method, and thus first gate electrodes 208, 209 and first auxiliary electrodes 210a, 210b, 211a, and 211b are formed in a desired pattern. The electrodes are formed as gate electrodes (hereinafter, described as first gate electrodes in the embodiment) in a TFT having a thin gate insulating film, and formed as auxiliary electrodes (hereinafter, described as first auxiliary electrodes in the embodiment) in a TFT having a thick gate insulating film. The first auxiliary electrodes in a TFT are preferably arranged with an optional interval. Typically, the electrodes are arranged with an interval approximately equal to the channel length (4 to 12 μm, preferably 6 to 10 μm).

Next, doping is performed into the crystalline semiconductor film except for a channel forming region. Although not shown in FIG. 2A, in a TFT having a thick gate insulating film (in FIGS. 2A–2D, TFT in which the gate insulating film comprises G1 and G2), the doping is performed after the crystalline semiconductor film between the first auxiliary electrodes (that is, areas between regions 210a and 210b, and between regions 211a and 211b in FIG. 2A) is covered by resist masks so that the doping is not performed thereto. The LDD region is formed by performing the doping. The dopant that pertains the n-type or p-type is added to LDD regions 210, 218 in a P-channel type TFT and LDD regions 215, 217 in a N-channel type TFT in a density range of $1 \times 10^{17}$ to $1 \times 10^{18}/cm^3$.

Next, as shown in FIG. 2B, the second gate insulating film 220 (hereinafter, shown as G2 in the embodiment and FIGS. 2A–2D) is formed. The first gate insulating film (G1) and second gate insulating film (G2) are gate insulating films for the TFT having a thick gate insulating film (in FIGS. 2A–2D, TFT in which the gate insulating film comprises G1 and G2). Thickness of the second gate insulating film (G2) is larger than that of the first gate insulating film, and preferably 5 to 100 nm.

Next, as shown in FIG. 2C, a second conductive film 221 is formed, then masks 222, 223 are formed using the photolithography technique, then an unnecessary area in the second conductive film is removed using a known etching method, and thus second gate electrodes and second auxiliary electrodes are formed in a desired pattern. In a TFT having a thin gate insulating film (in FIGS. 2A–2D, TFT in which the gate insulating film comprises G1), the second auxiliary electrodes are formed. On the other hand, in a TFT having a thick gate insulating film (in FIGS. 2A–2D, TFT in which the gate insulating film comprises G1 and G2), the second auxiliary electrodes and second gate electrodes are formed.

When the second conductive film is etched, first, the resist masks 222, 223 are formed in an area where the second gate electrodes are formed. After that, the second conductive film is etched, thereby the second auxiliary electrodes 231a to 234a and 231b to 234b are formed. In this case, by properly fitting conditions, the second auxiliary electrodes having a curved surface, that is, the second auxiliary electrodes 231a to 234a and 231b to 234b that incline towards the first gate insulating film 207 and second insulating film 220 formed on the semiconductor layers 203 to 206 in an optional pattern are formed.

Then, the second gate electrodes 235, 236 are formed by removing the resist masks.

Next, as shown in FIG. 2D, doping is performed using the first gate electrodes 208, 209, second auxiliary electrodes 231a to 234a and 231b to 234b, second gate electrodes 235, 236, and first auxiliary electrodes 210a, 210b, 211a, and 211b as masks, thereby the source region and drain region are formed. The dopant that pertains the n-type or p-type is added to the source region or drain region 241, 243 in the P-channel type TFT and the source region or drain region 240, 242 in the N-channel type TFT in a density range of $1 \times 10^{20}$ to $1 \times 10^{21}/\text{cm}^3$. The LDD region can be provided by performing the doping to the crystalline semiconductor film under the first auxiliary electrodes 210a, 210b, 211a, and 211b.

According to the above process, an n-channel type TFT 250 or a p-channel type TFT 251 having a thin gate insulating film, and an n-channel type TFT 252 or a p-channel type TFT 253 having a thick gate insulating film can be formed on a same substrate at the same time.

In the embodiment, since each of the first gate electrodes, first auxiliary electrodes, second gate electrodes, and second auxiliary electrodes is patterned individually, an optional voltage can be applied to respective electrodes. Therefore, in consideration of functions required for respective TFTs, an optional voltage is applied to the first auxiliary electrodes and second auxiliary electrodes, thereby carrier density in the crystalline semiconductor film under respective auxiliary electrodes can be controlled. That is, the hot carrier effect can be restrained with a similar function as the LDD. Typically, in a low-on-current TFT, resistance can be preferably decreased in the crystalline semiconductor film by controlling the applied voltage to the auxiliary electrodes and increasing the carrier density. In a high-off-current TFT, the resistance can be preferably increased in the crystalline semiconductor film by controlling the applied voltage to the auxiliary electrodes and restraining the carrier density.

Electrical potential of the first auxiliary electrodes and second auxiliary electrodes need not be fixed, and can be changed with time in consideration of functions required for respective TFTs. That is, in a TFT, it is possible to increase the on-current or decrease the off-current by adjusting the voltage applied to the auxiliary electrodes. In this case, the voltage applied to the auxiliary electrodes can be properly controlled according to the required off-current or on-current. The second gate electrodes and second auxiliary electrodes can be unseparated or connected with each other.

According to the above process, TFTs with the gate insulating films each having different thickness and the LDD region can be made on a same substrate by using a conventional process without using a special process. Moreover, the first auxiliary electrodes and second auxiliary electrodes are provided at a vicinity of the channel forming region and the LDD region. Therefore, the carrier density in the crystalline semiconductor film under respective auxiliary electrodes can be adjusted finely by applying an optional voltage to the first auxiliary electrodes and second auxiliary electrodes. Thus, the hot carrier effect can be further restrained. Therefore, the TFT having a thin gate insulating film is used as the TFT for the function circuit, and the TFT having a thick gate insulating film is used as the TFT for the pixel area and the TFT for the driving circuit, thereby the operating characteristics and reliability of a semiconductor device can be improved and a low consumption design is enabled.

Embodiment Mode 3

An example of the invention is shown in FIGS. 3A–3D. In this embodiment, the second auxiliary electrodes are formed only in the TFT having the thin gate insulating film (in FIGS. 3A–3D, TFT in which the gate insulating film comprises G1) in the active matrix substrate described in the first embodiment.

As shown in FIG. 3A, a crystalline semiconductor film is formed on a substrate 301 through an insulating film 302 as a base film, and then the crystalline semiconductor film is etched in an optional pattern and thus separated crystalline semiconductor films 303 to 306 are formed. Then, a first gate insulating film (hereinafter, shown as G1 in the embodiment and FIGS. 3A–3D) 307 is deposited. The first gate insulating film (G1) 307 has a small thickness, and the thickness of the first gate insulating film is 1 to 100 nm, preferably 5 to 50 nm.

Next, a first conductive film is deposited, then masks (not shown) are formed using the photolithography technique, then an unnecessary area in the first conductive film is removed using a known etching method, and thus first gate electrodes 308, 309 and first auxiliary electrodes 310a, 310b, 311a, and 311b are formed in a desired pattern. The electrodes are formed as the gate electrodes (hereinafter, described as first gate electrodes in the embodiment) in a TFT having a thin gate insulating film, and formed as the auxiliary electrodes (hereinafter, described as first auxiliary electrodes in the embodiment) in a TFT having a thick gate insulating film. The first auxiliary electrodes in a TFT are preferably arranged with an optional interval. Typically, the electrodes are arranged with an interval approximately equal to the channel length (4 to 12 μm, preferably 6 to 10 μm).

Next, as shown in FIG. 3B, the second gate insulating film 320 (hereinafter, shown as G2 in the embodiment and FIGS. 3A–3D) is formed. The first gate insulating film (G1) and second gate insulating film (G2) are gate insulating films for the TFT having a thick gate insulating film (in FIG. 3, TFT in which the gate insulating film comprises G1 and G2), and thickness of the second gate insulating film (G2) is larger than that of the first gate insulating film, and preferably 5 to 100 nm. Next, a second conductive film 321 is formed, and then the second conductive film 321 is partially covered by a resist mask 322.

Next, an unnecessary area in the second conductive film is removed using a known etching method, and thus second auxiliary electrodes 331a, 331b, 332a, and 332b are formed in a desired pattern. In this case, by properly fitting conditions, the second auxiliary electrodes having a curved surface, that is, the second auxiliary electrodes 331a, 331b, 332a, and 332b that incline towards the first gate insulating film 302 formed on the semiconductor layers 303 to 306 in an optional pattern are formed. Next, resist masks 333, 335, and 336 are formed (FIG. 3C).

Next, the second conductive film is etched in a desired pattern, thereby second gate electrodes are formed. Then, the second gate electrodes 337, 338 are formed by removing the resist masks 333, 335, and 336.

In the embodiment, the second auxiliary electrodes 331a, 331b, 332a, and 332b are formed first, and then the second gate electrodes 337, 338 are formed, however, the steps can be performed reversely. That is, the second auxiliary electrodes can be formed after forming the second gate electrodes first.

Next, doping is performed using the first gate electrodes 308, 309, the second auxiliary electrodes 331a, 331b, 332a, and 332b, the second gate electrodes 337, 338, and the first auxiliary electrodes 310a, 310b, 311a, and 311b as masks, thereby the source region and drain region are formed. The dopant that pertains the n-type or p-type is added to the source region or drain region 341, 343 in the P-channel type TFT and the source region or drain region 340, 342 in the N-channel type TFT in a density range of $1 \times 10^{20}$ to $1 \times 10^{21}/cm^3$ (FIG. 3D).

The LDD region can be provided by performing the doping to the crystalline semiconductor film under the first auxiliary electrodes 310a, 310b, 311a, and 311b. According to the structure, the carrier density in the crystalline semiconductor film under respective auxiliary electrodes can be adjusted finely by applying an optional voltage to the first auxiliary electrodes.

According to the above process, an n-channel type TFT 350 or a p-channel type TFT 351 having a thin gate insulating film and an n-channel type TFT 352 or a p-channel type TFT 353 having a thick gate insulating film are formed at the same time.

In the embodiment, since each of the first gate electrodes, second auxiliary electrodes, second gate electrodes, and first auxiliary electrodes is patterned individually, an optional voltage can be applied to respective electrodes. Therefore, in consideration of functions required for respective TFTs, an optional voltage is applied to the first auxiliary electrodes and second auxiliary electrodes, thereby carrier density in the crystalline semiconductor film under respective auxiliary electrodes can be controlled. That is, the hot carrier effect can be restrained with a similar function as the LDD region. Typically, in a low-on-current TFT, resistance can be preferably decreased in the crystalline semiconductor film by controlling the applied voltage to the auxiliary electrodes and increasing the carrier density. In a high-off-current TFT, the resistance can be preferably increased in the crystalline semiconductor film by controlling the applied voltage to the auxiliary electrodes and decreasing the carrier density.

Electrical potential of the first auxiliary electrodes and second auxiliary electrodes need not be fixed, and can be changed with time in consideration of functions required for respective TFTs. That is, in a TFT, it is possible to increase the on-current or decrease the off-current by adjusting the voltage applied to the auxiliary electrodes. In this case, the voltage applied to the auxiliary electrodes can be properly controlled according to the required off-current or on-current.

According to the above process, TFTs with the gate insulating films each having different thickness can be made on a same substrate by using a conventional process without using a special process. Moreover, even if the LDD region is not formed, the carrier density in the crystalline semiconductor film under respective auxiliary electrodes can be changed by applying an optional voltage to the first auxiliary electrodes and second auxiliary electrodes. Thus, the hot carrier effect, which may occur at a junction interface between the channel forming region and the source region or drain region, can be restrained. Therefore, the TFT having a thick gate insulating film is used as the TFT for the driving circuit such as the shift resistor circuit, level shifter circuit, buffer circuit, or sampling circuit and as the pixel TFT, thereby a TFT having a high withstanding voltage characteristics enables a low power consumption design and a high reliability. Furthermore, a TFT having a short channel length and a thin gate insulating film is used as the TFT for the functional circuits including the CPU, DRAM, image processing circuit, and audio processing circuit, thereby the operating characteristics and reliability can be improved.

Embodiment Mode 4

An example of the invention is shown in FIGS. 4A–4D. In this embodiment, the active matrix substrate described in the second embodiment is made without forming the second auxiliary electrodes.

As shown in FIG. 4A, a crystalline semiconductor film is formed on a substrate 401 through an insulating film 402 as a base film, and then the crystalline semiconductor film is etched in an optional pattern and thus separated crystalline semiconductor films 403 to 406 are formed. Then, a first gate insulating film (hereinafter, shown as G1 in the embodiment and FIGS. 4A–4D) 407 is deposited. The first gate insulating film (G1) 407 has a small thickness, and the thickness of the first gate insulating film is 1 to 100 nm, preferably 5 to 50 nm.

Next, a first conductive film is deposited, then masks (not shown) are formed using the photolithography technique, then an unnecessary area in the first conductive film is removed using a known etching method, and thus first gate electrodes 408, 409 and first auxiliary electrodes 410a, 410b, 411a, and 411b are formed in a desired pattern. The electrodes are formed as the gate electrodes (hereinafter, described as first gate electrodes in the embodiment) in a TFT having a thin gate insulating film. On the other hand, the electrodes are formed as the auxiliary electrodes (hereinafter, described as first auxiliary electrodes in the embodiment) in a TFT having a thick gate insulating film. The first auxiliary electrodes in a TFT are preferably arranged with an optional interval. Typically, the electrodes are arranged with an interval approximately equal to the channel length (4 to 12 μm, preferably 6 to 10 μm).

Next, doping is performed into the crystalline semiconductor film except for a channel forming region. Although not shown in FIG. 4A, in a TFT having a thick gate insulating film (in FIGS. 4A–4D, TFT in which the gate insulating film comprises G1 and G2), the doping is performed after the crystalline semiconductor film between the first auxiliary electrodes (that is, areas between regions 410a and 410b, and between regions 411a and 411b in FIG. 4A) are covered by the resist masks so that the doping is not performed thereto. The LDD region is formed by performing the doping. The dopant that pertains the n-type or p-type is added to the LDD regions 416, 418 in a P-channel type TFT and the LDD regions 415, 417 in a N-channel type TFT in a density range of $1\times10^{17}$ to $1\times10^{18}/cm^3$.

Next, as shown in FIG. 4B, the second gate insulating film 420 (hereinafter, shown as G2 in the embodiment and FIGS. 4A–4D) is formed. The first gate insulating film (G1) and second gate insulating film (G2) are gate insulating films for the TFT having a thick gate insulating film (in FIGS. 4A–4D, TFT in which the gate insulating film comprises G1 and G2). Thickness of the second gate insulating film (G2) is larger than that of the first gate insulating film, and preferably 5 to 100 nm. Next, a second conductive film 421 is formed, and then masks 422, 423 are formed using the photolithography technique.

Next, as shown in FIG. 4C, an unnecessary area in the second conductive film is removed using a known etching method, and thus the second gate electrodes 435, 436 are formed in a desired pattern.

Next, a resist mask 431 is formed for forming a source region and drain region on the n-channel type TFT, then doping is performed using the first gate electrodes 408, 409, second gate electrodes 435, 436, first auxiliary electrodes 410a, 410b, 411a, and 411b, and resist mask 431 as masks, thereby the source region and drain region are formed. The dopant that pertains the n-type or p-type is added to a source region or drain region 441, 443 in the P-channel type TFT and a source region or drain region 440, 442 in the N-channel type TFT in a density range of $1\times10^{20}$ to $1\times10^{21}/cm^3$. On the other hand, dopant that pertains the n-type is added to the LDD region in the n-channel type TFT 450 in a density range of $1\times10^{17}$ to $1\times10^{8}/cm^3$.

The LDD region can be provided by performing the doping to the crystalline semiconductor film under the first auxiliary electrodes 410a, 410b, 411a, and 411b. According to the structure, carrier density in the crystalline semiconductor film under respective auxiliary electrodes can be adjusted finely by applying an optional voltage to the first auxiliary electrodes.

In stead of using the resist mask 431 for forming the LDD region, after forming the first electrodes 408 and 409 in FIG. 4A, an insulating film such as a silicon oxide film may be formed on side surfaces of the first electrodes, and etched, thereby an insulating film having a curved surface and an approximately triangular shape can be formed on side surfaces of the first electrodes. Then, the LDD region may be formed by doping an impurity element using the insulating film having a curved surface and an approximately triangular shape as a mask.

According to the above process, the n-channel type TFT 450 having a thin gate insulating film and the LDD region, a single-drain p-channel type TFT 451, an n-channel type TFT 452 and a p-channel type TFT 453 having auxiliary electrodes and a thick gate insulating film are formed at the same time.

According to the above process, TFTs with the gate insulating films having is different thickness each can be made on a same substrate by using a conventional process without using a special process. The carrier density in the crystalline semiconductor film under respective auxiliary electrodes can be changed by applying an optional voltage to the first auxiliary electrodes. Thus, the hot carrier effect can be further restrained. Therefore, the TFT having a thick gate insulating film is used as the TFT for the driving circuit such as the shift register circuit, level shifter circuit, buffer circuit, or sampling circuit and as the pixel TFT, thereby a TFT having a high withstanding voltage characteristics enables a low power consumption design and a high reliability. Furthermore, a TFT having a short channel length and a thin gate insulating film is used as the TFT for the functional circuits including the CPU, DRAM, image processing circuit, and audio processing circuit, thereby the operating characteristics and reliability can be improved.

Embodiment 1

A manufacturing method of a liquid crystal display device using an active matrix substrate having a functional circuit region and a pixel region will be described in reference to FIG. 5

An active matrix display device using a TFT for a switching device has a structure wherein a substrate having pixel electrodes arranged in matrix (an active matrix substrate) and a counter substrate including counter electrodes are placed opposite each other with a liquid crystal film therebetween. The distance between the substrates is kept constant by a spacer or the like. A liquid crystal layer is sealed between the substrates by a seal member placed on the outer periphery of the pixel portion.

An example of manufacturing an active matrix substrate having a functional circuit region and a pixel region is described below. In this embodiment, the TFT structure shown in Embodiment Mode 1 is applied. In FIG. 5, only an n-channel TFT 542 will be explained because both of n-channel TFTs 542 and 543 in the pixel region have the same structure.

First, a base film 502 formed of an insulating film such as a silicon oxide film, a silicon nitride film, or a silicon oxynitride film is formed on a substrate 501 by using a known technique. The base film may have a single layer or a laminate of two or more layers of the insulating film. In this embodiment, a base film with two layers is formed. A silicon oxynitride film with a thickness of 10 to 100 nm is formed as a first base film on the substrate surface with plasma CVD, and next, a silicon oxynitride film with a thickness of 50 to 150 nm is formed as a second base film on the first base film with plasma CVD. Note that, barium borosilicate glass is used for the substrate in this embodiment, however, aluminoborosilicate glass, synthetic quartz glass, silicon, metal, stainless, or plastic having heat resistance that can withstand a treatment temperature in this embodiment may be used.

Next, a semiconductor film with a thickness of 25 to 70 nm (preferably 30 to 50 nm) is formed over the second base film, a mask (not shown) is formed using the technique of photolithography, an unnecessary area is removed by known etching technique, thus, a semiconductor film with a desired form is obtained. Note that, for forming a semiconductor film, a known method (an amorphous silicon film formed by sputtering, LPCVD, plasma CVD or the like is formed into a crystalline silicon film through solid phase precipitation, laser crystallization or thermal crystallization using metal, or such) can be adapted. The material of the semiconductor film is not limited, however, it is preferable to form the film comprising silicon or a silicon germanium (SiGe) alloy. In this embodiment, an amorphous silicon film with a thickness of 50 nm is formed, a crystalline semiconductor film is formed with the irradiation of a laser beam, thereafter, a semiconductor film is formed by etching.

When a crystalline silicon film is manufactured by laser crystallization, laser such as a pulse oscillation type or a continuous emission type excimer laser, a YAG laser or a YVO$_4$ laser is used. A method of condensing laser light emitted from a laser oscillator into a linear shape by an optical system and then irradiating the light to the semiconductor film may be employed when these types of lasers are used. The crystallization conditions may be suitably selected by the operator, however, the pulse frequency is set to 30 Hz, and the laser energy density is set from 100 to 400 mJ/cm$^2$ (typically between 200 and 300 mJ/cm$^2$) when the excimer laser is used. Further, the second harmonic is utilized when the YAG laser is used, the pulse frequency is set from 1 to 10 Hz, and the laser energy density may be set from 300 to 600 mJ/cm$^2$ (typically between 350 and 500 mJ/cm$^2$). The laser light which has been condensed into a linear shape with a width of 100 to 1000 μm, for example 400 μm, is then irradiated over the entire surface of the substrate. The irradiation is performed with an overlap ratio of 50 to 90% for the linear shape laser light.

Further, after the formation of a semiconductor film, a minute amount of impurity element (boron or phosphorus) is doped, in order to control the threshold voltage of TFTs (not shown).

Next, a first gate insulating film 503 with a thickness of 1 to 100 nm, preferably 5 to 50 nm, is formed over a base film surface and a semiconductor layer using a known technique. In this embodiment, the gate insulating film 503 is formed from a silicon oxynitride film with a thickness of 50 nm by plasma CVD. Note that, the first gate insulating film is not limited to the silicon oxynitride film, and other insulating films (a silicon oxide film or a silicon nitride film) may be used.

Subsequently, a first conductive film is formed by a known film formation technique. In this embodiment, the first conductive film is formed by first laminating a tantalum nitride film with a thickness of 30 nm on the first gate insulating film, and next laminating a tungsten film with a thickness of 370 nm threover. The tantalum nitride film and the tungsten film are formed by sputtering.

Note that, in this embodiment, the first conductive film is formed with the lamination of a tantalum nitride film and a tungsten film, however, the material is not limited thereto. Accordingly, one element selected from the group consisting of tantalum (Ta), tungsten (W), titanium (Ti), molybdenum (Mo), Aluminum (Al), copper (Cu), chromium (Cr), neodymium (Nd), or an alloy material or a compound material comprising the above elements in major proportions may be used for forming the conductive film. Besides, an alloy of silver, copper and palladium (AgPdCu alloy) may also be used.

Next, after masks (not shown) are formed using a photolithography technique, then an unnecessary area in the first conductive film is removed using a known etching method (RIE, ECR and the like), and thus first gate electrodes 505 and 504, and first auxiliary electrodes 506a, and 506b, are formed.

Subsequently, a second gate insulating film 507 with a thickness of 5 to 100 nm is formed over the first gate insulating film, the first gate electrodes, and first auxiliary electrodes using a known technique.

In this embodiment, a silicon oxynitride film with a thickness of 60 nm is deposited by plasma CVD. Note that, the second gate insulating film is not limited to a silicon oxynitride film, and other insulating films (a silicon oxide film or a silicon nitride film) may be used.

Next, a second conductive film is formed. In this embodiment, the second conductive film is formed into a lamination of a tantalum film with a thickness of 30 nm and a tungsten film with a thickness of 370 nm.

Subsequently, an unnecessary area in the second conductive film is removed using a known etching method (RIE, ECR and the like), and thus the second conductive film is formed into second gate electrodes and second auxiliary electrodes. First, a portion to be the second gate electrodes are covered with resist masks, the second auxiliary electrodes 509a, 509b, 510a, 510b, 512a, and 512b can be formed simultaneously by etching the second conductive film.

An impurity element is doped to a semiconductor film by a known technique (such as ion doping, ion plantation) by using the first gate electrodes 505 and 504, the second gate electrodes 508, the first auxiliary electrodes 506a and 506b, and the second auxiliary electrodes 509a, 509b, 510a, 510b, 512a, and 512b as masks, and thus a source region and a drain region is formed. In this embodiment, the amount of the dose is set to 1×10$^{15}$/cm$^2$ and the accelerating voltage is set to 80 keV when an n-type impurity is doped. Note that, elements belonging to the periodic table group 15 are generally used as the n-type impurity element, generally, phosphorous (P) or arsenic (As) are used. In this embodiment, a compound including phosphorous (P) is used as the impurity. In this case, a p-channel TFT is covered with a resist mask in order to prevent an n-type impurity from getting mixed thereinto.

Next, the amount of the dose is set to 3×10$^{15}$/cm$^2$ and the accelerating voltage is set to 30 keV when a p-type impurity is doped. Note that, elements belonging to the periodic table group 13 are generally used as the p-type impurity element; typically, boron (B) can be used. In this case, a n-channel TFT is covered with a resist mask in order to prevent a p-type impurity from getting mixed thereinto.

Through the steps described above, source regions 515 and drain regions 517, which exhibit n-type, and source regions and a drain region 516, which exhibit p-type are formed.

Subsequently, a heat treatment is performed to recover the crystallinity of the semiconductor film, and to activate the impurity element doped to the respective semiconductor films. Thermal annealing using an annealing furnace, laser annealing, or rapid thermal annealing (RTA) may be performed for the heat treatment. In this embodiment, the heat treatment is performed in a nitrogen atmosphere at 550° C. for four hours by thermal annealing.

Then, a first interlayer insulating film 520 and a second interlayer insulating film 521 are formed. The first interlayer insulating film 520 may be formed into a single layer or the lamination of the films. In this embodiment, a silicon nitride film with a thickness of 50 nm is formed into the first interlayer insulating film 520 by plasma CVD. Hydrogenation may be performed by a heat treatment (at 300 to 150° C. for 1 to 12 hours) thereafter. This step is performed to passivate the dangling bonds with hydrogen included in the first interlayer insulating film 520. Note that, the hydrogenation may also be performed by plasma hydrogenation (hydrogen exited by plasma is used), or by a heat treatment in an atmosphere containing hydrogen of 3–100% at 300 to 450° C. for 1 to 12 hours. In this embodiment, a heat treatment is performed in a nitrogen atmosphere at 410° C. for one hour.

Subsequently, a film comprising inorganic material or organic material can be formed into the second interlayer insulating film. In this embodiment, after forming a silicon oxide film 521 with a thickness of 800 nm, the planarization is performed by etchback.

Thereafter, contact holes leading to the source region 516 and the drain regions 515 and 517, and wirings 522 to 525 are formed to be electrically connected with the source region and the drain regions respectively.

Note that, these wirings are formed by etching the laminated film of a titanium film with a thickness of 100 nm, an alloy film (typically, an alloy film of aluminum and silicon) with a thickness of 350 nm, and a titanium film with a thickness of 100 nm. Note that, the material of the wirings is not limited to the alloy of titanium, aluminum, and silicon, and other materials with low resistance may be used.

Next, a third interlayer insulating film 530 is formed. In this embodiment, an acrylic resin film with a thickness of 530 nm is formed. Note that, the third interlayer insulating film 530 shall have a laminated structure; a light shielding film may be formed between the interlayer insulating films by etching a film with high light shielding characteristics comprising Al, Ti, W, Cr, black resin into a desired form. This shielding film is reticulated and disposed so as to shield the portion excepting the pixel electrodes.

Subsequently, a contact hole leading to the drain wiring in a pixel region is formed, a conductive film with a thickness of 100 nm is formed, a pixel electrode 531 is formed by etching the conductive into a desired form. Note that, a metal film with high optical reflectance for gate electrodes: typically, a film including silver or aluminum in major proportions, or the laminated film thereof may be used to obtain a reflection type liquid crystal device. A translucent conductive film, typically, indium-tin oxide (ITO), an alloy of indium oxide and zinc oxide, zinc oxide, or the like may be used to obtain a transmissive liquid crystal display device.

Thus, a functional circuit 554 comprising an n-channel TFT 540 and a p-channel type TFT 541, and a pixel portion 555 comprising pixel TFTs 542 and 543 can be formed on one and the same substrate. Consequently, an active matrix substrate is finished.

As described above, a TFT including a thin gate insulating film is applied to the TFT of the functional circuits (typically, a CPU, a DRAM, an image processing circuit, a sound processing circuit and the like), and a TFT including a thick insulating film is applied to the TFT of the driving circuits or the TFT of the pixel region (typically a buffer circuit, a shift register circuit, a level shifter circuit, a sampling circuit, and the like). That enables improvement in reliability and the performance characteristics of a semiconductor device, and that also enables reduction in power consumption. Note that, in this embodiment, a TFT of a driving circuit (a shift register circuit, a level shifter circuit, a sampling circuit, and the like) is not described, however, the n-channel TFT and the p-channel type TFT, each having thick gate insulating films according to Embodiment Modes 1 to 4 may be applied.

Note that, TFTs according to Embodiment Mode 1 are applied to the TFTs of a functional circuit region and a pixel region in this embodiment, however, it is not limited thereto, and the TFTs according to Embodiment Mode 2 to Embodiment Mode 4 may also be applied.

Embodiment 2

Figure 6:
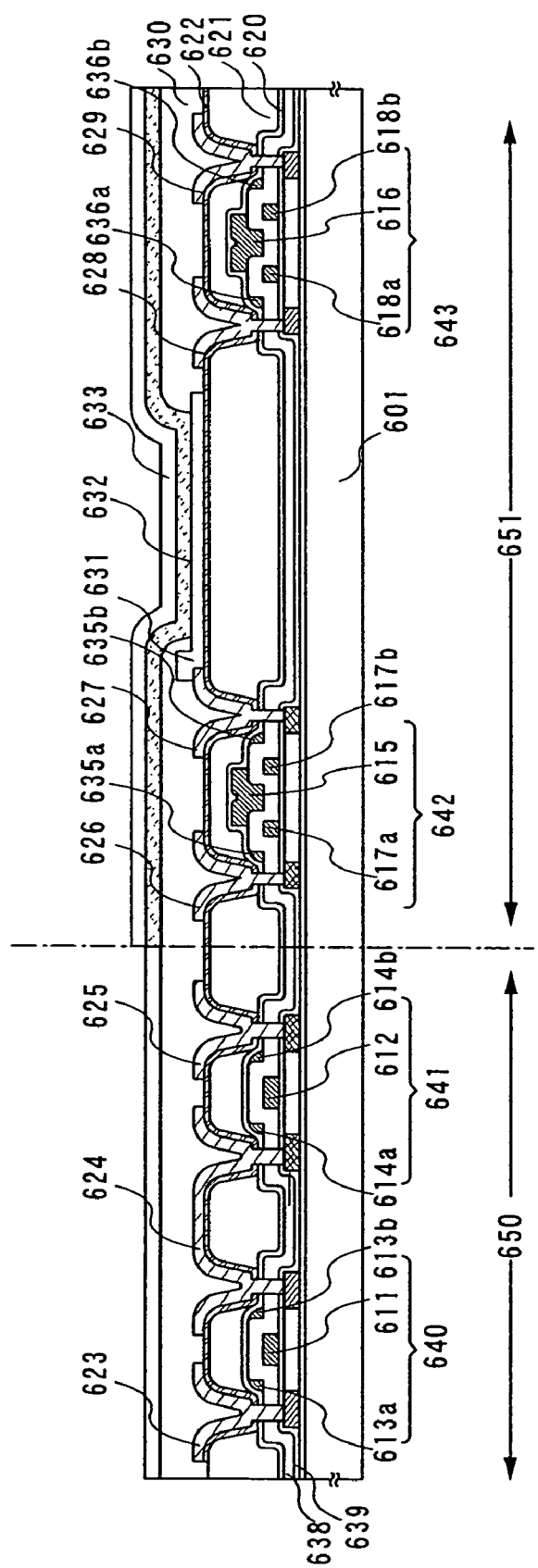
FIG. 6 shows an example of a cross sectional view of an EL display device (Embodiment 2)

A manufacturing method of an EL display device using an active matrix substrate with a pixel region and a functional circuit region will be described here in reference to FIG. 6.

An EL display device using TFTs as switching devices comprising a substrate (an active matrix substrate) wherein pixel electrodes are arranged in matrix, and sealing member. And a counter electrode is formed over an EL layer on the pixel electrode. The substrate and the sealing member are sealed with an adhesive.

An example of manufacturing an active matrix substrate is explained below.

Through the steps similar to the one according to Embodiment 1, an n-channel TFT 640 and a p-channel TFT 641 are formed in a functional circuit region, a current controlling TFT 642 formed from a p-channel TFT, and a switching TFT 643 formed from an n-channel TFT are formed in a pixel region. Note that, in this embodiment, a TFT structure described in Embodiment Mode 1 is applied. Namely, the n-channel TFT 640 and the p-channel TFT 641 in the functional circuit region have first gate electrodes 611 and 612, and second auxiliary electrodes 613a, 613b, 614a, and 614b. The current controlling TFT 642 and the switching TFT 643 in the pixel region have second gate electrodes 615 and 616, first auxiliary electrodes 617a, 617b, 618a, and 618b, and second auxiliary electrodes 635a, 635b, 636a, and 636b.

Next, a first interlayer insulating film 620 formed from a silicon nitride film with a thickness of 100 nm is formed over the n-channel TFT 640, the p-channel TFT 641, the current controlling TFT 642, a second gate insulating film of the switching TFT 643, second auxiliary electrodes and second gate electrodes. The semiconductor layer thereof is hydrogenised thereafter by heat treatment at 300 to 550° C. for 1 to 12 hours. In this embodiment, the layer is heated in a nitrogen atmosphere at 410° C. for one hour. This step is performed to passivate the dangling bonds of the respective semiconductor films with hydrogen included in the first interlayer insulating film 620.

Then, a second interlayer insulating film 621 comprising an organic insulating material is formed over the first interlayer insulting film. Organic resin with positive photosensitivity or negative photosensitivity is used as an organic insulating material. When photosensitive organic resin is used, the exposure is performed by photolithography, and a first opening with a curvature can be formed by etching the photosensitive organic resin. Thus, the formation of the opening with a curvature allows electrodes to be formed to have the higher coverage. In this embodiment, a photosensitive acrylic resin film with a thickness of 1.05 µm is formed as the second interlayer insulating film. The first opening having a gently sloping inner wall is formed thereafter by etching and pattering the second interlayer insulating film.

Note that, since organic resin with positive photosensitivity is colored with brown, when the organic resin with positive photosensitivity is used as the second interlayer insulating film 621, it is required to be decolorized after etching.

Next, a third interlayer insulating film 622 comprising a nitride insulating film (generally, a silicon nitride film or a silicon oxynitride film) is formed so as to cover the first opening and the second interlayer insulating film 621. In this embodiment, a silicon nitride film is used for the third interlayer insulating film. Outgas which generates from the second interlayer insulating film can be reduced by forming the third interlayer insulating film comprising a nitride insulating film.

After the exposure by photolithography is performed, the third interlayer insulating film 622, the second interlayer insulating film 621, the first interlayer insulating film 620, a second gate insulating film 638, and a first insulating film 639 are etched sequentially, thus a second opening is formed. Here, the etching may be performed by either of dry etching or wet etching. In this embodiment, the second opening is formed by dry etching.

After the second opening is formed, a metal film is formed over the third interlayer insulating film and the second opening; a source electrode, drain electrodes 623 to 629, and wirings (not shown) are formed following the exposure by photolithography. One element selected from the group consisting of molybdenum (Mo), tungsten (W), titanium (Ti), molybdenum (Mo), aluminum (Al), or an alloy material of a compound comprising the above elements may be used for forming the metal film. In this embodiment, a titanium film/an aluminum silicon alloy film/a titanium film are laminated with a thickness of 100 nm/350 nm/100 nm each, thereafter, the source electrodes and drain electrodes 623 to 629 and wirings (not shown) are formed by patterning and etching the metal film into a desired form.

Subsequently, after a first electrode 631 is formed, the fourth interlayer insulating film and the third opening are formed. An inorganic material or an organic material may be used for the fourth interlayer insulating film. In this embodiment, a photosensitive acrylic resin film is used for the fourth interlayer insulating film, and a third opening having a gently sloping inner wall is formed thereafter by wet etching and pattering the fourth interlayer insulating film.

A layer containing a light emitting material 632, a second electrode 633 which functions as a cathode, and a passivation film (not shown) are provided over the first electrode 631 and a fourth interlayer insulating film 630. The lamination of the first electrode 631, the layer containing a light emitting material 632, and the second electrode 633 substantially makes a light emitting element.

A known structure can be applied to the layer containing a light emitting material 632. The film containing a light emitting material provided between the first electrode 631 and the second electrode 633 includes such as a light emitting layer, a hole injecting layer, an electron injecting layer, a hole transporting layer, and an electron transporting layer, the layer comprising a light emitting material may have a configuration wherein those layers are laminated, or a configuration wherein some of the materials or all of the materials are mixed. Specifically, a light emitting layer, a hole injecting layer, an electron injecting layer, a hole transporting layer, and an electron transporting layer and the like are included. An EL element generally has a structure in which an anode, a light emitting layer and a cathode are laminated sequentially. Alternatively, the EL element may have a structure in which an anode, a hole injecting layer, a light emitting layer, and a cathode are laminated in this order, or a structure in which as an anode, a hole injecting layer, a light emitting layer, an electron transporting layer, and a cathode are laminated in this order.

A light emitting layer generally includes an organic compound. Generally, the light emitting layer has one or a plurality of layers selected from lower molecular organic compounds, intermediate molecular organic compounds such as oligomer and dendrimer, and polymer organic compounds on the basis of their number of molecules. Further, the light emitting layer may be combined with an electron injecting-transporting region having electron injecting-transporting property or a hole injecting-transporting region each formed from inorganic compounds having hole injecting-transporting property.

Light emitting materials which mainly compose the light emitting layer are given below. A metal complex such as tris-8-quinolinolate aluminum complex or bis-(benzoquinolinorate) beryllium complex, phenyl anthracene derivative, tetra-aryl diamine derivative, or distyril benzene derivative may be used as a low molecular organic compound. By using the selected compound as a host material, coumarin derivative, DCM, quinacridon, rubrene, or the like are doped as a dopant, so that a raise in the quantum efficiency, high luminance and improvement in efficiency may be achieved.

A polymer molecular organic compound may be selected from polyparaphenylene vinylenes, polyparaphenylene, polythiophenes, polyfluorenes, and so on. Concretely, it may be selected from poly(p-phenylene vinylene): (PPV), poly (2,5-dialkoxy-1,4-phenyene vinylene): (RO-PPV), poly[2-(2'-ethylhexoxy)-5-methoxy-1,4-phenylene vinylene]: (MEH-PPV), poly[2-dialkoxyphenyl]-1,4-phenylene vinylene]: (ROPh-PPV), poly[p-phenylene]: (PPP), Poly(2, 5-dialkoxy-1,4-phenylene): (RO-PPP), poly(2,5-dihexoxy-1,4-phenylene), polythiophene: (PT), poly(3-alkylthiophene): (PAT), poly(3-hexylthiophene): (PHT), poly(3-cyclohexylthiophene): (PCHT), poly(3-cyclohexyl-4-methylthiophene): (PCHMT), poly(3,4-dicyclohexylthiophene): (PDCHT), poly[3-(4-octylphenyl)-thiophene]: (POPT), poly[3-(4-octylphenyl)-2,2-bithiophene]: (PTOPT), polyfluorene: (PF), poly(9,9-dialkylfluorene): (PDAF), poly(9,9-dioctylfluorene): (PDOF), and so on.

An inorganic compound selected from diamond-like carbon (DLC), Si, Ge, CN, and oxides or nitrides thereof, optionally, the above compounds doped with P, B, N, or the like may be used for the electron injecting-transporting layer. Further, it may be oxides, nitrides or fluorides of alkali metals or alkali earth metal. Furthermore, compounds or alloys of these metals with at least one of Zn, Sn, V, Ru, Sm, and In may be used.

Further, a mixed and joined structure of the respective layers above may be used.

Note that, the luminescence of an EL element can be divided into two types: one that emits light (fluorescent light) when a singlet excited state returns back to a ground state and another that emits light (phosphorescent light) when a triplet excited state returns back to the ground state. Either or both types of the luminescence can be used for the EL element according to the present invention.

A multi-component alloy or compound, which is constituted of a metal component and a component containing either or both of alkali metal and alkali earth metal, is used for the second electrode 633. Al, Au, Fe, V, and Pd are given as examples of the metal components. Specific examples of alkali metal or alkali earth metal include Li (lithium), Na (sodium), K (potassium), Rb (rubidium), Cs (cesium), Mg (magnesium), Ca (calcium), Sr (strontium), and Ba (barium). In addition, Yb (ytterbium), Lu (lutetium), Nd (neodymium), Tm (thulium), or the like may be applied. It is defined that the composition of the second electrode corresponds to an alloy or compound in which 0.01 to 10 wt. % of alkali metal or alkali earth metal with the work function of 3 eV or less is contained in the metal component. For the purpose of making the second electrode function as the cathode, the thickness of the second electrode may be appropriately set, and the second electrode may be formed by an electron beam evaporation method in the thickness range of about 0.01 to 1 µm.

The passivation film (not shown) may be selected from a silicon nitride film, aluminum nitride film, a diamond-like carbon film, and other insulating films having high blocking abilities to water and oxygen.

Through the above steps, an active matrix substrate for an EL display device in which a functional circuit 650 comprising an n-channel TFT 640 and a p-channel TFT 641, a pixel region 651 comprising a current controlling TFT 642 of a p-channel type, and a switching TFT 643 of n-channel type are formed on one and the same substrate. Note that, in this embodiment, a TFT for a driving circuit (a shift register circuit, a decoder circuit, a memory circuit, a level shifter circuit, a sampling circuit, or the like) is not described, however, the n-channel TFT and the p-channel type TFT, each having a thick gate insulating film according to Embodiment Modes 1 to 4 may be applied.

Further, a TFT of Embodiment Mode 1 is applied to a TFT in this embodiment, however, it is not limited thereto; TFTs described in Embodiment Modes 2 to 4 may be applied alternatively.

Thus, a TFT including a thin gate insulating film is applied to the TFT of the functional circuits (typically, a CPU, a DRAM, an image processing circuit, a sound processing circuit and the like), and a TFT including a thick gate insulating film is applied to the TFT of a pixel region or the TFT of the driving circuits (typically a buffer circuit, a shift register circuit, a level shifter circuit, a sampling circuit, and the like). These TFTs enable improvement in reliability and the performance characteristics of an EL display device and also enable reduction in power consumption.

Embodiment 3

In this embodiment, an embodiment of a method for forming the semiconductor layer used for the TFTs in Embodiment Modes 1–4 and Embodiments 1 and 2 is described using FIGS. 7A–7D. In the embodiment, an amorphous silicon film formed on an insulating surface is crystallized by scanning a continuous wave laser beam on the film.

Figure 7A:
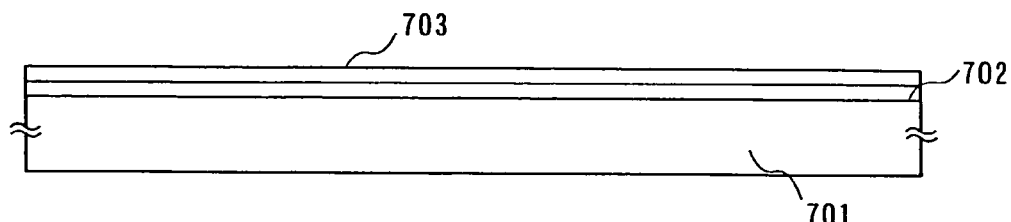
FIGS. 7A–7D show Embodiment 3.

In FIG. 7A, a base film 702 comprising a silicon oxynitride film 100 nm thick is formed on a glass substrate 701. An amorphous silicon film 703 is formed in thickness of 54 nm by plasma CVD method on the base film.

Figure 7B:
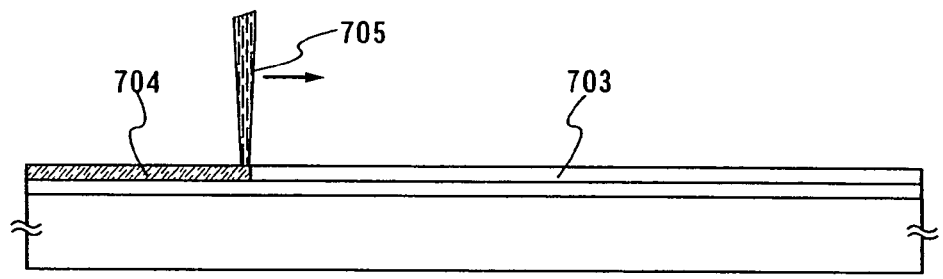

Next, as shown in FIG. 7B, a laser beam is irradiated over the semiconductor layer. The laser beam used for irradiating the semiconductor layer is a continuous beam radiated from an Nd:YVO$_4$ laser device, the beam is a second harmonic (532 nm) obtained from a wavelength conversion element. The continuous wave laser beam is converged into an oblong ellipsoid pattern by an optical system, and the substrate 701 and an irradiating position of the laser beam 705 are moved relatively with each other, thereby the amorphous silicon film 703 is crystallized, and thus a crystalline silicon film 704 is formed. A cylindrical lens with F20 is used as the optical system, which can make a laser beam with 2.5 mm in diameter into an oblong ellipsoid pattern having a major axis of 2.5 mm and a minor axis of 20 µm on an irradiated surface.

Naturally, another laser device can be used, and a laser device using a crystal comprising a crystal of YAG, YVO$_4$, YLF, or YAlO$_3$ doped with Cr, Nd, Er, Ho, Ce, Co, Ti, or Tm can be used as a continuous-wave solid-state laser device.

Figure 7C:
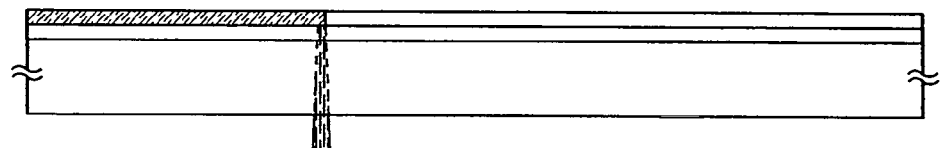

Furthermore, an ultraviolet laser beam, which is obtained from converting an infrared laser beam emitted from a solid-state laser to a green laser beam by a nonlinear optical element, then further converting the beam by another nonlinear optical element, can be used. When the second harmonic (532 nm) from the Nd:YVO$_4$ laser device is used, since the laser beam passes through the glass substrate 701 and base film 702, a laser beam 706 can be irradiated from a glass substrate 701 side as shown in FIG. 7C.

Figure 7D:
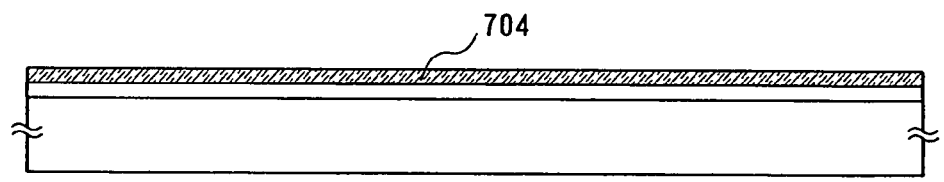

In this way, as shown in FIG. 7D, the crystallization proceeds at the area irradiated by the laser beam 705 or 706, and thus the crystalline silicon film 704 can be formed. The laser beam scan may be not only a one-way scan, but also a reciprocating scan. In the reciprocating scan, laser energy density can be changed for one scan to cause a gradual crystal growth. In addition, the crystallization can be combined with a hydrogen desorption treatment, which is often required in a case of crystallization of an amorphous silicon film, where a first scan is performed in a low energy density and hydrogen is desorbed thereby, then a second scan is performed in an increased energy density to complete the crystallization. A crystalline silicon film, in which crystal grains extend along a scan direction of the laser beam, can be also obtained in such production method. Then, semiconductor layers divided into an island pattern are formed, which can be used in the Embodiment 1.

The configuration shown in the embodiment is merely an example, and a combination with another laser device or optical system can be used as long as a similar effect is obtained.

In this way, the method for forming the semiconductor layer of the embodiment is applied to Embodiment 1 and Embodiment 2, thereby the operational characteristics and reliability of the semiconductor device can be further improved and the low power consumption design is enabled.

Embodiment 4

In this embodiment, an embodiment of a method for forming the semiconductor layer used for the TFT in Embodiments 1 and 2 is described using FIGS. 8A–8D. In the embodiment, an amorphous silicon film formed on an insulating surface is previously crystallized, and increase of crystal grain size is intended using a continuous wave laser beam.

Figure 8A:
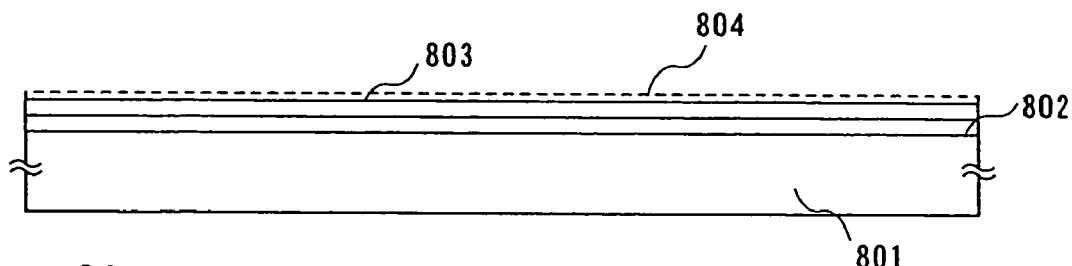
FIGS. 8A–8D show Embodiment 4.

As shown in FIG. 8A, a base film 802 and an amorphous silicon film 803 are formed on a glass substrate 801 as shown the Embodiment 1. Then, an aqueous solution containing 5 ppm of nickel acetate salt is spin coated for adding Ni as a metal element that accelerates lowering of crystallization temperature and crystal growth, and thus a layer 804 containing a catalyst element is formed.

Figure 8B:
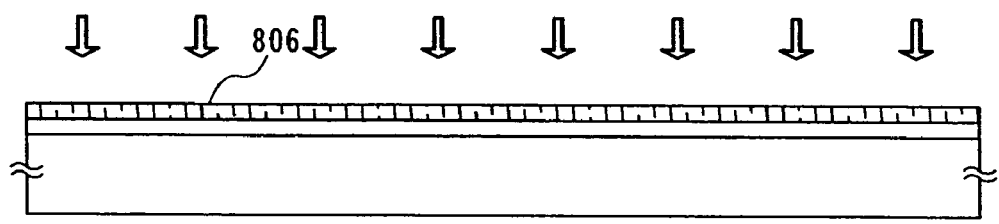

Then, as shown in FIG. 8B, the amorphous silicon film is crystallized through a heat treatment at 580° C. for 4 hours. The crystallization spreads with forming silicide in the amorphous silicon film due to an effect of Ni, at the same time, crystal growth occurs. A crystalline silicon film 806 formed in this manner comprises a mass of rod-like or needle-like crystals, and each of the crystals grows in a particular direction macroscopically, therefore the film has a uniform crystallinity. Moreover, there is a feature of high orientation ratio of (110) face.

Figure 8C:
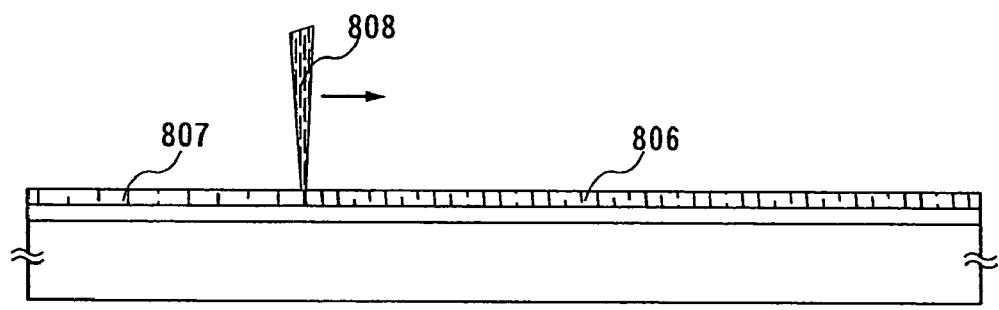
Figure 8D:
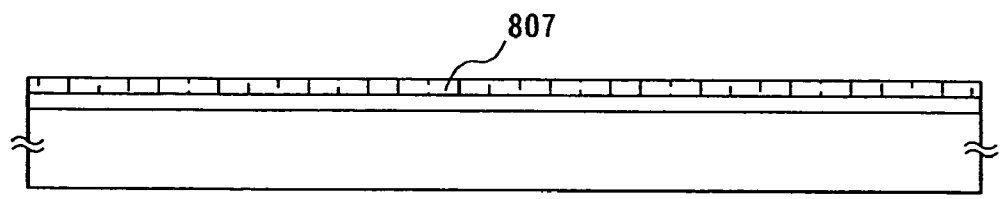

Then, as shown in FIG. 8C, a continuous wave laser beam 808 is scanned, thereby crystallinity of the crystalline silicon film 806 is improved, and then, a crystalline silicon film 807 as shown in FIG. 8D is obtained. The crystalline silicon film is melt and recrystallized by the laser beam irradiation. With this recrystallization, crystal growth occurs such that the crystal grains extend along a scan direction of the laser beam. In this case, since the crystalline silicon film in which the crystal faces are previously arranged uniformly is formed, separation of a different crystal face or generation of dislocation can be prevented. Then, semiconductor layers divided into an island pattern are formed, which can be used in Embodiment 1 or Embodiment 2.

In this way, the method for producing the semiconductor layer of the embodiment is applied to Embodiment 1 and Embodiment 2, thereby the operational characteristics and reliability of the semiconductor device can be further improved and the low power consumption design is enabled.

Embodiment 5

Figure 9A:
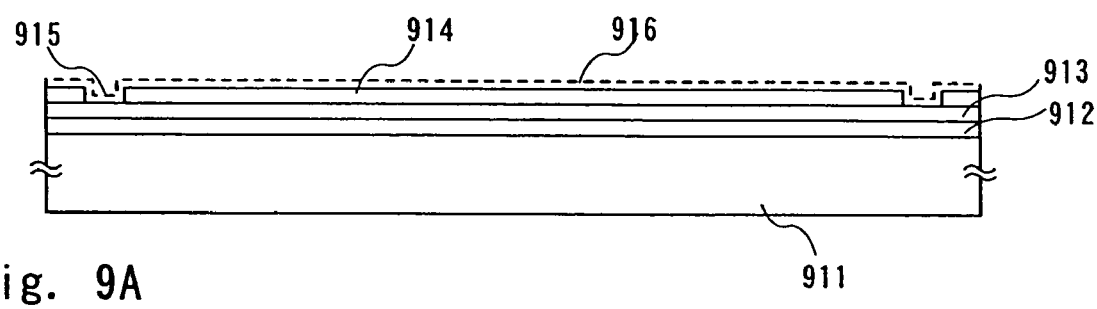
FIGS. 9A–9C show Embodiment 5.
Figure 9B:
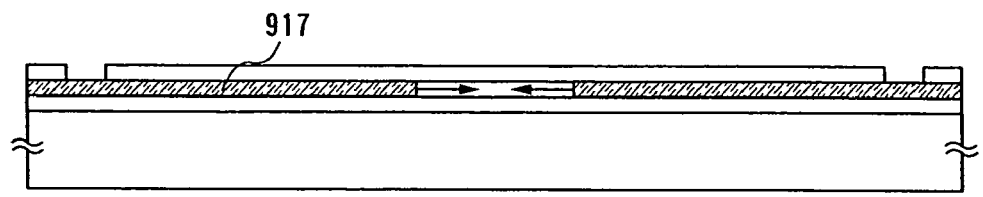
Figure 9C:
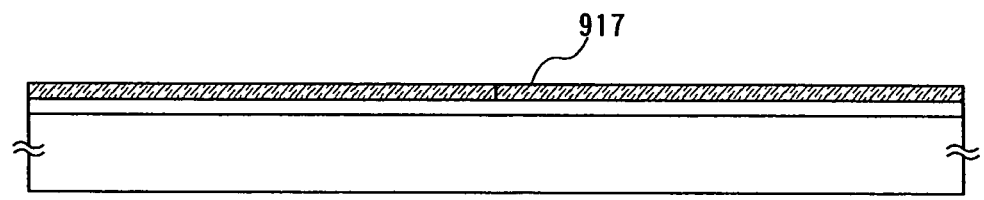

In this embodiment, an embodiment of a method for producing the semiconductor layer used for the TFT in Embodiment 1 or Embodiment 2 is described using FIGS. 9A–9C.

As shown in FIG. 9A, a base film 912 and an amorphous silicon film 913 are formed on a glass substrate 911 as shown in the Embodiment 3. A silicon oxide film having thickness of 100 nm is formed by plasma CVD method using the insulating film 914 as a mask, and then an opening 915 is formed. Then, an aqueous solution 916 containing 5 ppm of nickel acetate salt is spin coated for adding Ni as a catalyst element. The Ni contacts with the amorphous silicon film at the opening 915.

Then, as shown in FIG. 9B, the amorphous silicon film is crystallized through a heat treatment at 580° C. for 4 hours. The crystallization grows in a direction parallel to a substrate surface from the opening 915 due to the effect of the catalyst element. A crystalline silicon film 917 formed in this manner comprises rod-like or needle-like crystals, and each of crystals grows in a particular direction macroscopically, therefore the film has a uniform crystallinity. Moreover, there is a feature of high orientation ratio in a particular direction.

After the heat treatment is completed, the mask insulating film 914 is etched and removed, thereby a crystalline silicon film 917 can be obtained as shown in FIG. 9C. Then, semiconductor layers divided into an island pattern are formed, which can be used in Embodiment 1 or Embodiment 2.

Embodiment 6

In the method for forming the semiconductor layer of the Embodiment 4 or Embodiment 5, after forming a crystalline silicon film 1007, an additional process for removing the catalyst element remained in the film in a density of more than $10^{19}/cm^3$ by gettering can be included. In this embodiment, the gettering process is described.

Figure 10:
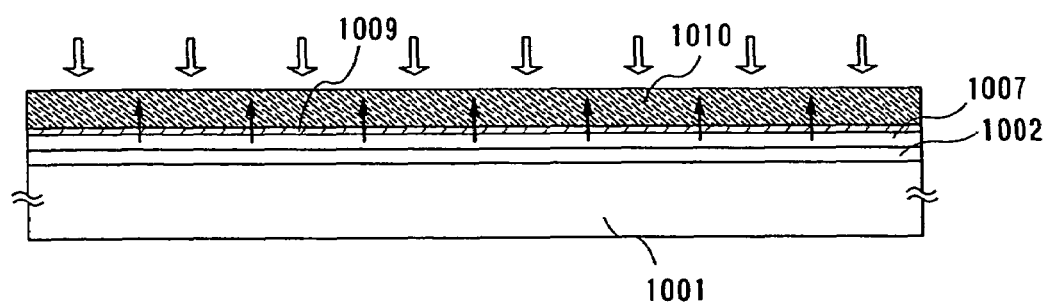
FIG. 10 shows Embodiment 6.

As shown in FIG. 10, a barrier layer 1009 comprising a thin silicon oxide film is formed on the crystalline silicon film 1007, and then an amorphous silicon film to which $1 \times 10^{20}/cm^3$ to $1 \times 10^{21}/cm^3$ of argon or phosphor is added is formed on the barrier layer as a gettering site 1010 by sputtering.

Then, by a heat treatment at 600° C. for 12 hrs using a furnace anneal oven, or heat treatment at 650 to 800° C. for 30 to 60 min by RTA using lamp or heated gas as a heating source, the Ni added as the catalyst element can be segregated at the gettering site 1010. Density of the catalyst element in the crystalline silicon film 1007 can be reduced to $10^{17}/cm^3$ or less by this treatment.

The gettering treatment performed in a similar condition is also effective for the crystalline silicon film formed in the Embodiment 3. A small amount of metal element, which is contained in the crystalline silicon film formed by irradiating the amorphous silicon film with the laser beam, can be removed by the gettering treatment.

In this way, the gettering method of the embodiment is applied to Embodiment 3 to Embodiment 5, thereby the operational characteristics and reliability of the semiconductor device can be further improved and the low power consumption design is enabled.

Embodiment 7

Figure 13:
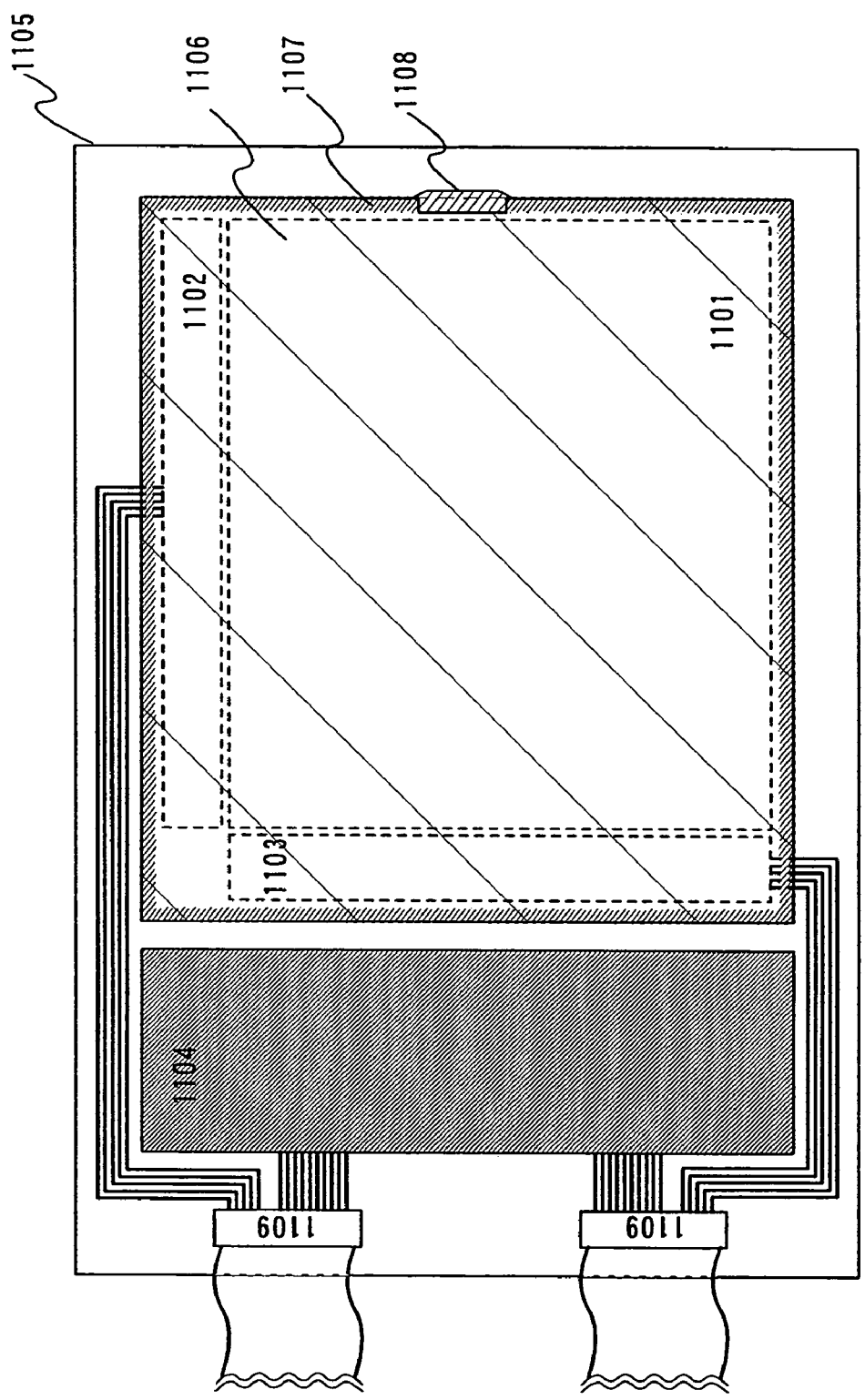
FIG. 13 shows a liquid crystal module.

In this embodiment, a process for manufacturing an active matrix type liquid crystal module using the active matrix substrate of the Embodiment 1 is described below. The description is made using FIG. 13.

In the center of an active matrix substrate 1105, a pixel area 1101 is arranged. At an upper side of the pixel area 1101, a source driving circuit 1102 for driving a source signal line is arranged. At a left side of the pixel area 1101, a gate driving circuit 1103 for driving a gate signal line is arranged. In the example shown in the embodiment, the gate driving circuit 1103 is arranged only at one side of the pixel area, however, the arrangement may be bilateral symmetrical with respect to the pixel, and a designer can choose proper one in consideration of a substrate size of a liquid crystal module. However, from view of operating reliability or driving efficiency of the circuit, the bilateral symmetrical arrangement is desirable. In addition, a functional circuit 1104 is provided on a panel, and various signals output from the circuit are supplied to the pixel area 1101, source driving circuit 1102, and gate driving circuit 1103. The functional circuit 1104, which has been conventionally connected to an outside of the panel using FPC, is formed on the active matrix substrate, thereby miniaturization of a liquid crystal device is enabled.

Furthermore, supply voltage output from a power supply circuit (not shown) provided outside is supplied to the pixel area 1101, source driving circuit 1102, and gate driving circuit 1103 through FPC 1109 in the panel.

A seal adhesive 1107 is applied on the periphery of the driving circuits and pixel portion along the circumference of the substrate, and a counter substrate 1106 is adhered with keeping a constant gap (space between the substrate 1105 and counter substrate 1106) using a spacer that is previously formed on the active matrix substrate. Then, a liquid crystal material is infused from a portion where the seal adhesive 1107 is not applied, and then the portion is sealed by a sealing agent 1108. According to the above process, the liquid crystal module is completed.

Several ICs can be used in part of the driving circuit or functional circuit.

Moreover, in similar to the embodiment, various modules (an active matrix type EL module, active matrix type EC module, and the like) can be manufactured using the active matrix substrate of the present the invention.

Embodiment 8

Various modules (active matrix liquid crystal module, active matrix EL module and active matrix EC module) can be completed by implementing TFTs according to the present invention. Thus, the present invention can be applied to all of the electronic apparatuses incorporating these modules in display portions.

The following can be given as such electronic devices: portable information terminals (electronic notebooks, mobile computers, or mobile phones etc), video cameras, digital cameras, personal computers, TV sets, mobile phones, projectors, or the like. Embodiments thereof are shown in FIGS. 11A–11G and FIGS. 12A–12D.

Figure 11A:
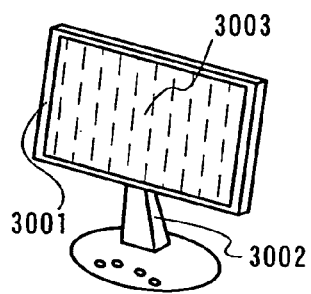
FIGS. 11A–11G show examples of electronic devices.

FIG. 11A is a TV set, which includes a case 3001, a support 3002, a display portion 3003 and the like. The TFT substrate manufactured according to the present invention is used for the display portion 3003, and thin and high-resolution TV sets can be completed.

Figure 11B:
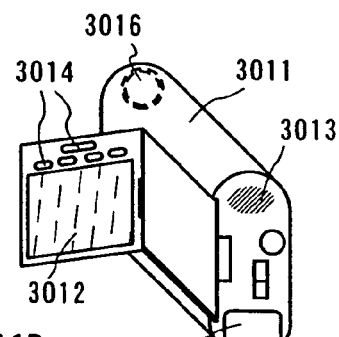

FIG. 11B is a video camera, which includes a main body 3011, a display portion 3012, an audio input portion 3013, operation keys 3014, a battery 3015, an image receiving portion 3016, and the like. The TFT substrate manufactured according to the present invention is used for the display portion 3012, and small-sized and high-resolution video camera can be completed.

Figure 11C:
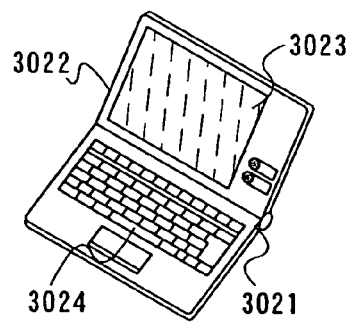

FIG. 11C is a notebook type personal computer, which includes a main body 3021, a frame 3022, a display portion 3023, a keyboard 3024, and the like. The TFT substrate manufactured according to the present invention is used for the display portion 3023, and small-sized and low consumption notebook type personal computer can be completed.

Figure 11D:
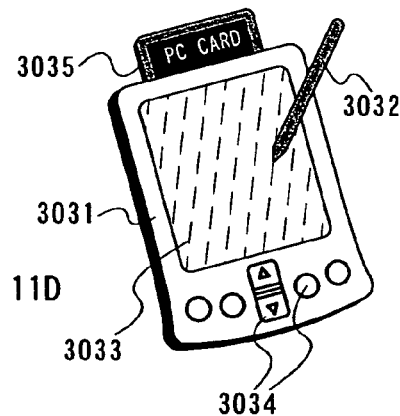

FIG. 11D is a PDA (Personal Digital Assistant), which includes a main body 3031, a stylus 3032, a display portion 3033, operation keys 3034, an external interface 3035, and the like. The TFT substrate manufactured according to the present invention is used for the display portion 3033, and small-sized, high-resolution, and high performance PDA can be completed.

Figure 11E:
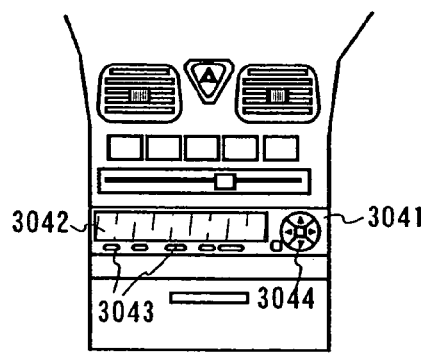

FIG. 11E is an audio player, in particular, a car audio sound system provided with a main body 3041, a display portion 3042, operation keys 3043 and 3044, and the like. The TFT substrate manufactured according to the present invention is used for the display portion 3042, and an audio player having a small-sized display device with high-resolution is completed.

Figure 11F:
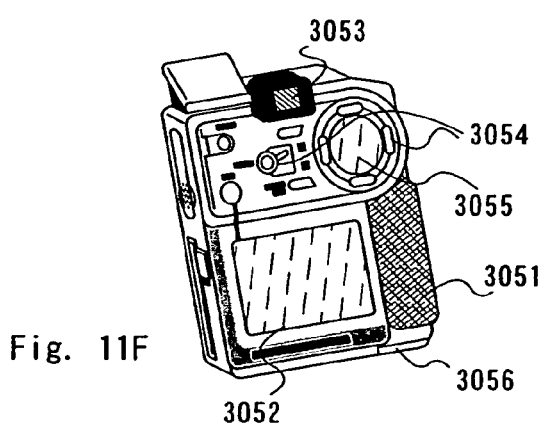

FIG. 11F is a digital camera, which includes a main body 3051, a display portion A3052, an eye piece 3053, operation keys 3054, a display portion B3055, a battery 3056, and the like. The TFT substrate manufactured according to the present invention is used for the display portions A3052 and B3055, and a digital camera having a small-sized display device with high-resolution is completed.

Figure 11G:
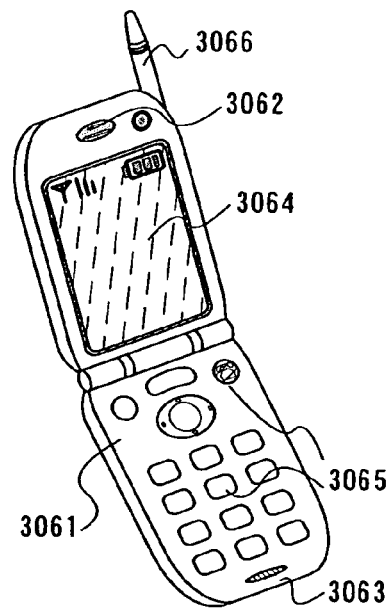

FIG. 11G is a mobile telephone, which includes a main body 3061, an audio output portion 3062, an audio input portion 3063, a display portion 3064, operation keys 3065, an antenna 3066, and the like. The TFT substrate manufactured according to the present invention is used for the display portion 3064, and a mobile phone having a small-sized display device with high-resolution is completed.

Figure 12A:
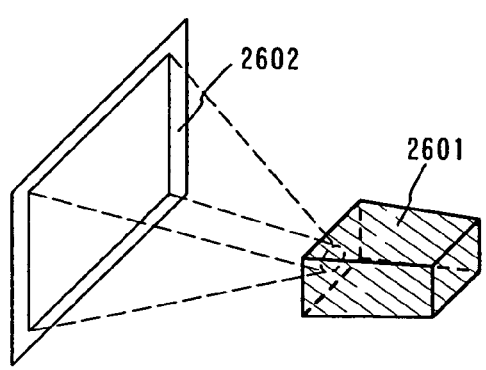
FIGS. 12A–12D show examples of electronic devices.

FIG. 12A shows a projector, which includes a projection device 2601, a screen 2602, and the like.

Figure 12B:
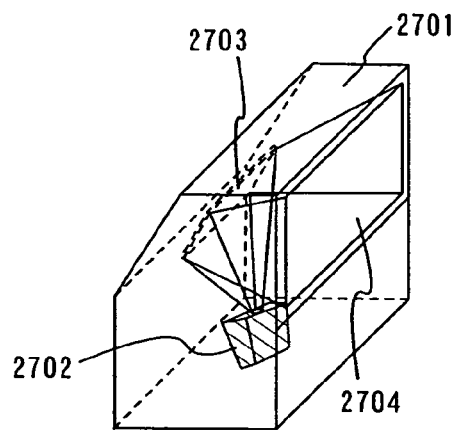

FIG. 12B shows a rear projector, which includes a main body 2701, a projection device 2702, a mirror 2703, a screen 2704, and the like.

Figure 12C:
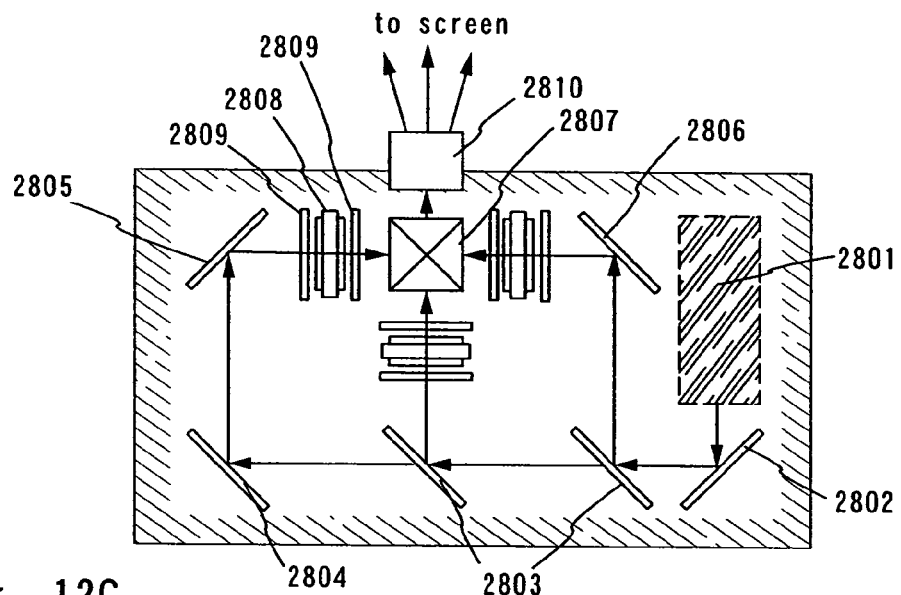

FIG. 12C is a diagram showing an example of the structure of the projection devices 2601 and 2702 in FIGS. 12A and 12B. Each of the projection devices 2601 and 2702 comprises a light source optical system 2801, mirrors 2802 and 2804 to 2806, a dichroic mirror 2803, a prism 2807, a liquid crystal display device 2808, a retardation plate 2809, and a projection optical system 2810. The projection optical system 2810 is an optical system including a projection lens. Shown in this embodiment is a three-plate type, and there is no particular limitation. For example, it may be a single-plate type. An optical system such as an optical lens, a film having a polarizing function, a film for adjusting the phase difference, or an IR film may be provided in the light path indicated by the arrow in FIG. 12C, if necessary.

Figure 12D:
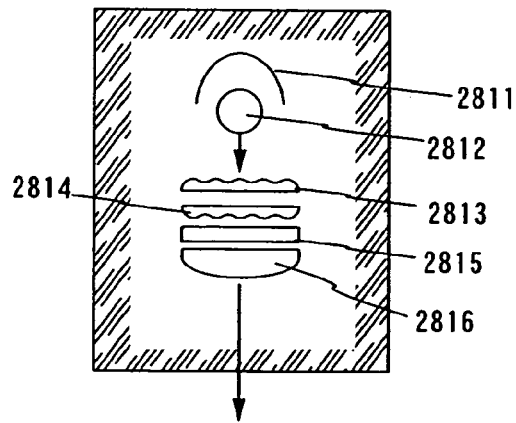

FIG. 12D is a diagram showing an example of the structure of the light source optical system 2801 in FIG. 12C. In this embodiment, the light source optical system 2801 includes a reflector 2811, a light source 2812, lens arrays 2813 and 2814, a polarization scrambler 2815, and a condenser lens 2816. The light source optical system shown in FIG. 12D is merely an example and is not to limit the present invention. For example, an optical system such as an optical lens, a film having a polarizing function, a film for adjusting the phase difference, or an IR film may be provided in the light source optical system, if necessary.

FIGS. 12A and 12B show a case where a transmission type active matrix liquid crystal module is used. Alternatively, a reflection type active matrix liquid crystal module may be applied although the example thereof is not shown here.

In addition, electronic devices illustrated here are only a few examples among many, and the applications of the TFTs according to the present invention are not limited thereto.

According to the above process, TFTs with the gate insulating films each having different thickness can be formed on a same substrate without using a special process. Moreover, even if the LDD region is not formed, the carrier density in the crystalline semiconductor film under respective auxiliary electrodes can be changed by applying an optional voltage to the first and second auxiliary electrodes. Thus, the hot carrier effect, which may occur at a junction interface between the channel forming region and the source region or drain region, can be restrained. Therefore, the TFT having a thin gate insulating film is used as a TFT for the function circuit (typically, the CPU, DRAM, image processing circuit, or audio processing circuit), and the TFT having a thick gate insulating film is used as a pixel TFT or TFT for the driving circuit (typically, the buffer circuit, shift register circuit, level shifter circuit, or sampling circuit), thereby the operational characteristics and reliability of the semiconductor device can be improved, and the low power consumption design is enabled. Furthermore, the pixel portion, driving circuits, and function circuits can be provided on a same substrate, thereby a module, which has been conventionally used for a display device such as a liquid crystal module or EL module, can be miniaturized, and thus an electronic apparatus having a display device can be manufactured to have a convenient configuration for a portable.

What is claimed is:

1. A semiconductor device comprising:
   a semiconductor layer formed on an insulating surface and the semiconductor layer comprising a channel forming region;
   a first insulating film formed on the semiconductor layer, the first insulating film formed to cover an entire surface of the channel forming region;
   a first auxiliary electrode formed over the semiconductor layer with the first insulating film interposed therebetween;
   a second insulating film formed on and in contact with the first insulating film and the first auxiliary electrode, the second insulating film formed to cover the entire surface of the channel forming region with the first insulating film interposed therebetween; and
   a gate electrode formed over the channel forming region with the first insulating film and second insulating film interposed therebetween,
   wherein the first auxiliary electrode is formed outside of the channel forming region.

2. The semiconductor device according to claim 1, wherein the first insulating film has a thickness of 1 to 100 nm, and the second insulating film has a thickness of 5 to 100 nm.

3. The semiconductor device according to claim 1, wherein the first insulating film has a thickness of 5 to 50 nm, and the second insulating film has a thickness of 5 to 100 nm.

4. The semiconductor device according to claim 1, wherein the first auxiliary electrode is partially overlapped with the gate electrode with the second insulating film interposed therebetween.

5. The semiconductor device according to claim 1, wherein the first auxiliary electrode is formed between the channel forming region and a drain region in the semiconductor layer.

6. The semiconductor device according to claim 1, wherein a second auxiliary electrode is formed over the semiconductor layer with the first insulating film interposed therebetween, and the second auxiliary electrode is formed between a source region and the channel forming region in the semiconductor layer.

7. The semiconductor device according to claim 1, wherein an impurity element is included in a portion of the semiconductor layer opposed to the first auxiliary electrode through the first insulating film.

8. The semiconductor device according to claim 1, wherein a first distance between the gate electrode and the semiconductor layer is longer than a second distance between the first auxiliary electrode and the semiconductor layer.

9. The semiconductor device according to claim 1, wherein a third auxiliary electrode is formed on the second insulating film.

10. The semiconductor device according to claim 9, wherein the third auxiliary electrode has a curved surface or an inclined surface.

11. A semiconductor device comprising:
 a semiconductor layer comprising a channel forming region;
 a first insulating film formed on the semiconductor layer, the first insulating film formed to cover an entire surface of the channel forming region;
 a first auxiliary electrode for controlling the carrier density between a source region or a drain region, and the channel forming region in the semiconductor layer;
 a second insulating film formed on the first insulating film and the first auxiliary electrode, the second insulating film formed to cover the entire surface of the channel forming region with the first insulating film interposed therebetween; and
 a gate electrode formed over the channel forming region with the first insulating film and second insulating film interposed therebetween.

12. The semiconductor device according to claim 11, wherein the first insulating film has a thickness of 1 to 100 nm, and the second insulating film has a thickness of 5 to 100 nm.

13. The semiconductor device according to claim 11, wherein the first insulating film has a thickness of 5 to 50 nm, and the second insulating film has a thickness of 5 to 100 nm.

14. The semiconductor device according to claim 11, wherein the first auxiliary electrode is partially overlapped with the gate electrode with the second insulating film interposed therebetween.

15. The semiconductor device according to claim 11, wherein the first auxiliary electrode is formed between the channel forming region and the drain region in the semiconductor layer.

16. The semiconductor device according to claim 11, wherein a second auxiliary electrode is formed over the semiconductor layer with the first insulating film interposed therebetween, and the second auxiliary electrode is formed between the source region and the channel forming region in the semiconductor layer.

17. The semiconductor device according to claim 11, wherein an impurity element is included in a portion of the semiconductor layer opposed to the first auxiliary electrode through the first insulating film.

18. The semiconductor device according to claim 11, wherein a first distance between the gate electrode and the semiconductor layer is longer than a second distance between the first auxiliary electrode and the semiconductor layer.

19. The semiconductor device according to claim 11, wherein a third auxiliary electrode is formed on the second insulating film.

20. The semiconductor device according to claim 19, wherein the third auxiliary electrode has a curved surface or an inclined surface.

21. A semiconductor device comprising:
 a first thin film transistor over a substrate, the first thin film transistor comprising a first semiconductor layer, a first gate insulating film, and a first gate electrode;
 a second thin film transistor over the substrate, the second thin film transistor comprising a second semiconductor layer, a second gate insulating film having a first film and a second film, and a second gate electrode; and
 a first auxiliary electrode formed between the first film and the second film,
 wherein the first auxiliary electrode is formed outside of a channel forming region in the second semiconductor layer, and
 wherein the first gate insulating film is thinner than the second gate insulating film.

22. The semiconductor device according to claim 21, wherein one of the first film and the second film is a same film as the first gate insulating film.

23. The semiconductor device according to claim 21, wherein the first gate insulating film has a thickness of 1 to 100 nm thick, and the second gate insulating film has a thickness of 6 to 200 nm.

24. The semiconductor device according to claim 21, wherein the first gate insulating film has a thickness of 5 to 50 nm thick, and the second gate insulating film has a thickness of 6 to 200 nm.

25. The semiconductor device according to claim 21, wherein the first auxiliary electrode is formed between a drain region and a channel forming region in the second semiconductor layer.

26. The semiconductor device according to claim 21, wherein a third auxiliary electrode is formed between the first film and the second film in the second gate insulating film, the third auxiliary electrode is formed between a source region and a channel forming region in the second semiconductor layer.

27. The semiconductor device according to claim 21, wherein the first auxiliary electrode is partially overlapped with the second gate electrode.

28. The semiconductor device according to claim 21, wherein each of the first auxiliary electrode, the first gate electrode, and the second gate electrode is connected to a different wiring.

29. The semiconductor device according to claim 21, wherein an impurity element is included in a portion of the semiconductor layer opposed to the first auxiliary electrode through the second gate insulating film.

30. The semiconductor device according to claim 21, wherein a first distance between the second gate electrode and the second semiconductor layer is longer than a second distance between the first auxiliary electrode and the second semiconductor layer.

31. The semiconductor device according to claim 21, wherein the first thin film transistor further comprises:
 an insulating film covering the first gate electrode and the first gate insulating film; and
 a second auxiliary electrode formed on the insulating film.

32. The semiconductor device according to claim 31, wherein the second auxiliary electrode has a curved surface or an inclined surface.

33. The semiconductor device according to claim 32, wherein each of the first auxiliary electrode, the second auxiliary electrode, the first gate electrode, and the second gate electrode are connected to a different wiring.

34. A semiconductor device comprising:
   a first thin film transistor over a substrate, the first thin film transistor comprising a first semiconductor layer, a first gate insulating film, and a first gate electrode;
   a second thin film transistor over the substrate, the second thin film transistor comprising a second semiconductor layer, a second gate insulating film having a first film and a second film, and a second gate electrode;
   a first auxiliary electrode for controlling the carrier density between a source region or drain region and a channel forming region in the second semiconductor layer,
   wherein the first auxiliary electrode is formed between the first film and the second film, and
   wherein the first gate insulating film is thinner than the second gate insulating film.

35. The semiconductor device according to claim 34, wherein one of the first film and the second film is a same film as the first gate insulating film.

36. The semiconductor device according to claim 34, wherein the first gate insulating film has a thickness of 1 to 100 nm thick, and the second gate insulating film has a thickness of 6 to 200 nm.

37. The semiconductor device according to claim 34, wherein the first gate insulating film has a thickness of 5 to 50 nm thick, and the second gate insulating film has a thickness of 6 to 150 nm.

38. The semiconductor device according to claim 34, wherein the first auxiliary electrode is formed between a drain region and a channel forming region in the second semiconductor layer.

39. The semiconductor device according to claim 34, wherein a third auxiliary electrode is formed between the first film and the second film in the second gate insulating film, the third auxiliary electrode is formed between a source region and a channel forming region in the second semiconductor layer.

40. The semiconductor device according to claim 34, wherein the first auxiliary electrode is partially overlapped with the second gate electrode.

41. The semiconductor device according to claim 34, wherein each of the first auxiliary electrode, the first gate electrode, and the second gate electrode is connected to a different wiring.

42. The semiconductor device according to claim 34, wherein an impurity element is included in a portion of the semiconductor layer opposed to the first auxiliary electrode through the second gate insulating film.

43. The semiconductor device according to claim 34, wherein a first distance between the second gate electrode and the second semiconductor layer is longer than a second distance between the first auxiliary electrode and the second semiconductor layer.

44. The semiconductor device according to claim 34, wherein the first thin film transistor further comprises:
   an insulating film covering the first gate electrode and the first gate insulating film; and
   a second auxiliary electrode formed on the insulating film.

45. The semiconductor device according to claim 44, wherein the second auxiliary electrode has a curved surface or an inclined surface.

46. The semiconductor device according to claim 45, wherein each of the first auxiliary electrode, the second auxiliary electrode, the first gate electrode, and the second gate electrode are connected to a different wiring.

47. A semiconductor device comprising:
   a semiconductor layer formed on an insulating surface and the semiconductor layer comprising a first region, at least one second region, a source region, and a drain region;
   a first insulating film formed on the semiconductor layer, the first insulating film formed to cover an entire surface of the first region and an entire surface of the second region;
   a first auxiliary electrode formed over the semiconductor layer with the first insulating film interposed therebetween;
   a second insulating film formed on and in contact with the first insulating film and the first auxiliary electrode, the second insulating film formed to cover the entire surface of the first region with the first insulating film interposed therebetween; and
   a gate electrode formed over the second insulating film,
   wherein the first region overlaps with the gate electrode, with the first insulating film and the second insulating film interposed therebetween, and does not overlap with the first auxiliary electrode,
   wherein the first region is formed between the source region and the drain region, the second region is formed between the first region and at least one of the source and drain regions, and
   wherein the first auxiliary electrode is formed over the second region with the first insulating film interposed therebetween.

48. The semiconductor device according to claim 47, wherein the first insulating film has a thickness of 1 to 100 nm, and the second insulating film has a thickness of 5 to 100 nm.

49. The semiconductor device according to claim 47, wherein the first insulating film has a thickness of 5 to 50 nm, and the second insulating film has a thickness of 5 to 100 nm.

50. The semiconductor device according to claim 47, wherein the first auxiliary electrode is partially overlapped with the gate electrode with the second insulating film interposed therebetween.

51. The semiconductor device according to claim 47, wherein an impurity element is included in the second region.

52. The semiconductor device according to claim 47, wherein the first auxiliary electrode controls the carrier density between the source region, the drain region, and the first region.

53. The semiconductor device according to claim 47, wherein a first distance between the gate electrode and the semiconductor layer is longer than a second distance between the first auxiliary electrode and the semiconductor layer.

54. The semiconductor device according to claim 47, wherein a second auxiliary electrode is formed on the second insulating film.

55. The semiconductor device according to claim 54, wherein the second auxiliary electrode has a curved surface or an inclined surface.

56. A semiconductor device comprising:
   a first semiconductor layer comprising a first region, a first source region, and a first drain region;
   a second semiconductor layer comprising a second region, at least one third region, a second source region, and a second drain region;

a first insulating film formed on the first and second semiconductor layers;

a first auxiliary electrode formed over the second semiconductor layer with the first insulating film interposed therebetween;

a first gate electrode formed over the first semiconductor layer with the first insulating film interposed therebetween;

a second insulating film formed on the first insulating film, the first auxiliary electrode, and the first gate electrode; and a second gate electrode formed over the second region with the first and second insulating films interposed therebetween, wherein the second region is formed between the second source region and the second drain region, the third region is formed between the second region and at least one of the second source and drain regions, and wherein the first auxiliary electrode is formed over the third region with the first insulating film interposed therebetween.

57. The semiconductor device according to claim 56, wherein the first insulating film has a thickness of 1 to 100 nm, and the second insulating film has a thickness of 5 to 100 nm.

58. The semiconductor device according to claim 56, wherein the first insulating film has a thickness of 5 to 50 nm, and the second insulating film has a thickness of 5 to 100 nm.

59. The semiconductor device according to claim 56, wherein the first auxiliary electrode is partially overlapped with the second gate electrode with the second insulating film interposed therebetween.

60. The semiconductor device according to claim 56, wherein an impurity element is included in the third region.

61. The semiconductor device according to claim 56, wherein the first auxiliary electrode controls the carrier density between the second source region, the second drain region, and the third region.

62. The semiconductor device according to claim 56, wherein a first distance between the second gate electrode and the second semiconductor layer is longer than a second distance between the first auxiliary electrode and the second semiconductor layer.

63. The semiconductor device according to claim 56, wherein a second auxiliary electrode is formed on the second insulating film.

64. The semiconductor device according to claim 63, wherein the second auxiliary electrode has a curved surface or an inclined surface.

* * * * *